(12) United States Patent
Chikamatsu

(10) Patent No.: US 9,689,900 B1
(45) Date of Patent: Jun. 27, 2017

(54) CURRENT SENSING CIRCUIT

(71) Applicant: Keysight Technologies, Inc., Minneapolis, MN (US)

(72) Inventor: Kiyoshi Chikamatsu, Tokyo (JP)

(73) Assignee: Keysight Technologies, Inc., Santa Rosa, CA (US)

( * ) Notice: Subject to any disclaimer, the term of this patent is extended or adjusted under 35 U.S.C. 154(b) by 14 days.

(21) Appl. No.: 14/968,734

(22) Filed: Dec. 14, 2015

(51) Int. Cl.
*G01R 1/20* (2006.01)
*G01R 15/14* (2006.01)

(52) U.S. Cl.
CPC .................................. *G01R 15/146* (2013.01)

(58) Field of Classification Search
CPC .. G01R 1/203; G01R 15/146; G01R 19/0007; G01R 1/20; G01R 1/22; G01R 23/165; G01R 23/167; G01R 33/3621
See application file for complete search history.

(56) References Cited

U.S. PATENT DOCUMENTS

| | | | | |
|---|---|---|---|---|
| 5,473,244 | A * | 12/1995 | Libove | G01R 1/22 324/126 |
| 6,411,078 | B1 * | 6/2002 | Nakagawa | G01R 15/183 324/117 H |
| 6,661,217 | B2 | 12/2003 | Kimball et al. | |
| 8,160,829 | B2 | 4/2012 | Kalenine | |
| 8,415,942 | B2 | 4/2013 | Fletcher | |
| 2010/0244845 | A1 * | 9/2010 | Morikawa | G01R 19/25 324/427 |

FOREIGN PATENT DOCUMENTS

| | | |
|---|---|---|
| JP | 2001/066329 A | 3/2001 |
| JP | 2004/205264 A | 7/2004 |
| JP | 4245236 B2 | 3/2009 |
| JP | 2011-038964 A | 2/2011 |

(Continued)

OTHER PUBLICATIONS

Sandeep Kamath et al., "Application Note AN092 : Measuring Bluetooth® Low Energy Power Consumption," Texas Instruments, 2012, pp. 1-24.

(Continued)

*Primary Examiner* — Tung X Nguyen

(57) ABSTRACT

A current sensing circuit for sensing current in a DUT includes first and second input terminals; a shunt resistor connected to the first input terminal; a shunt resistor sensing circuit that amplifies voltage between terminals of the shunt resistor; a low pass filter coupled to an output of the shunt resistor sensing circuit; a current transformer having a primary winding connected between a terminal of the shunt resistor and the second input terminal; a current transformer sensing circuit connected to a secondary winding of the current transformer and configured to amplify current from the secondary winding; and an adder configured to add outputs of the low pass filter and the first current transformer sensing circuit. The current transformer sensing circuit includes a first transimpedance amplifier and a first input resistor. The current transformer has a low frequency-side cutoff frequency equal to a cutoff frequency of the low pass filter.

20 Claims, 11 Drawing Sheets

(56) References Cited

FOREIGN PATENT DOCUMENTS

JP          2014-235045 A      12/2014

OTHER PUBLICATIONS

Silvio Ziegler et al., "Current Sensing Techniques: A Review", IEEE Sensors Journal, vol. 9, No. 4, Apr. 2009, pp. 354-376.
Tim Regan et al., "Current Sense Circuit Collection : Making Sense of Current", Linear Technology, Application Note 105, Dec. 2005, pp. 1-118.
"Current Probe CT6700/CT6701", Hioki, Dec. 11, 2014, pp. 1-4.
"CC2541 Keyfob Reference Design", Texas Instruments, 2013, http://www.ti.com/tool/cc2541keyfob-rd#Technical Documents, pp. 1-4.

\* cited by examiner

CURRENT SENSING CIRCUIT

BACKGROUND

Development of wireless communication devices targeting for sensor networks has been increasing. Such wireless communication devices are generally required to have more than one-year of operating life on a small-capacity batteries, such as coin cell batteries. In order to extend battery life as long as possible, a low-power consumption communication protocols, such as Bluetooth® low energy (BLE), have been developed, as well as integrated circuit (IC) chips compatible with corresponding standards of the protocols have been developed as well. A device including an IC chip compatible with BLE standards, for example, operates intermittently by repeating a sleep state and an active state in a current consumption-time waveform, examples of which are shown in FIG. 12A and FIG. 12B. For example, a current on the order of several tens of milliamps (mA) is consumed during an active state ("connection event") as shown in FIG. 12A, whereas current consumption is on the order of microamps (μA) or less, on average, during a sleep state ("sleep period") as shown in FIG. 12A, which is extremely low. The operating clock in the IC is on the order of 1 microsecond (μs), and the time required for transition from the active state to the sleep state is on the order of 1 μs.

In such a device, the operation state inside the IC can be obtained by measuring current consumption profile. Measuring the current consumption profile, however, is challenging because the current draw changes by over four digits, e.g., from several tens of mA to about 1 μA in less than 1 μs.

A conventional method of measuring current in a device under test (DUT) uses a shunt resistor of 10Ω across input terminals of an oscilloscope with voltage probe, connected to the DUT, effectively measuring the current by dividing the voltage by the resistance. This is described, for example, by S. Kamath et al., Application Note AN092, "Measuring Bluetooth® Low Energy Power Consumption," Texas Instruments Incorporated (2012), which is hereby incorporated by reference. A larger valued resistance works better for the measurement of low current on the order of 1 μA. In a simple example, a current waveform may be observed with a 1Ω shunt resistor and a sensing frequency bandwidth of 20 MHz. Assuming that the current is measured with the shunt resistor by a differential amplifier that has 1 nV/√Hz as input referred voltage noise spectral density, the root mean square (RMS) value of the current measurement noise is expected to be 1 nV/√Hz*√(20 MHz)/1 Ω=4.5 μA in root mean square (RMS).

Given this circumstance, it may be thought that the current waveform can be observed with noise on the order of μA or less by the choice of a 10Ω resistor. However, multiple bypass capacitors, e.g., approximately 1.5 μF in total, may be installed as parallel capacitors in a conventional measurement circuit in the DUT between a power supply voltage (Vcc) and ground (GND). To measure current draw from a coin cell battery to the IC and the bypass capacitors, a time constant made of the 10Ω shunt resistor and the 1.5 μF bypass capacitors becomes 15 μs, which is too long for the observation of the current draw change within 1 μs or less, thereby rendering the current waveform blunt. To avoid this situation, removing the bypass capacitors may theoretically enable faster current measurement, even with the 10Ω shunt resistor. However, a high speed IC may result in operation failure, and therefore measurement under a normal state operation may not be conducted.

As an alternative solution to avoid the long time constant, a shunt resistor may be inserted at the location of a power supply rail between the bypass capacitors and the IC. However, the resistance of the inserted shunt resistor can actually become an equivalent series resistance of the bypass capacitors, which is likely to cause operation failure in the IC. As stated above, fast current measurement should be conducted assuming that bypass capacitors having a capacitance on the above-mentioned order are connected between the Vcc and the GND.

The development of a wireless communication device, e.g., operating according to BLE or similar protocols, therefore requires current sensing means that can be used for observation of rapid current changes, and that has low noise with a wide current measurement range. It is therefore desirable for a current sensing means to have low noise performance that allows for an observation on the order of 1 μA, a wide dynamic range that allows for measurement ranging about five digits from about 1 μA to at least about 100 mA, a wide and flat frequency response from direct current (DC) to at least about 100 MHz, and fast response characteristics capable of tracking a current change that takes less than 1 μs when capacitance of a measurement circuit of the DUT is taken into account.

BRIEF DESCRIPTION OF THE DRAWINGS

The illustrative embodiments are best understood from the following detailed description when read with the accompanying drawing figures. It is emphasized that the various features are not necessarily drawn to scale. In fact, the dimensions may be arbitrarily increased or decreased for clarity of discussion. Wherever applicable and practical, like reference numerals refer to like elements.

DETAILED DESCRIPTION

Figure 1:
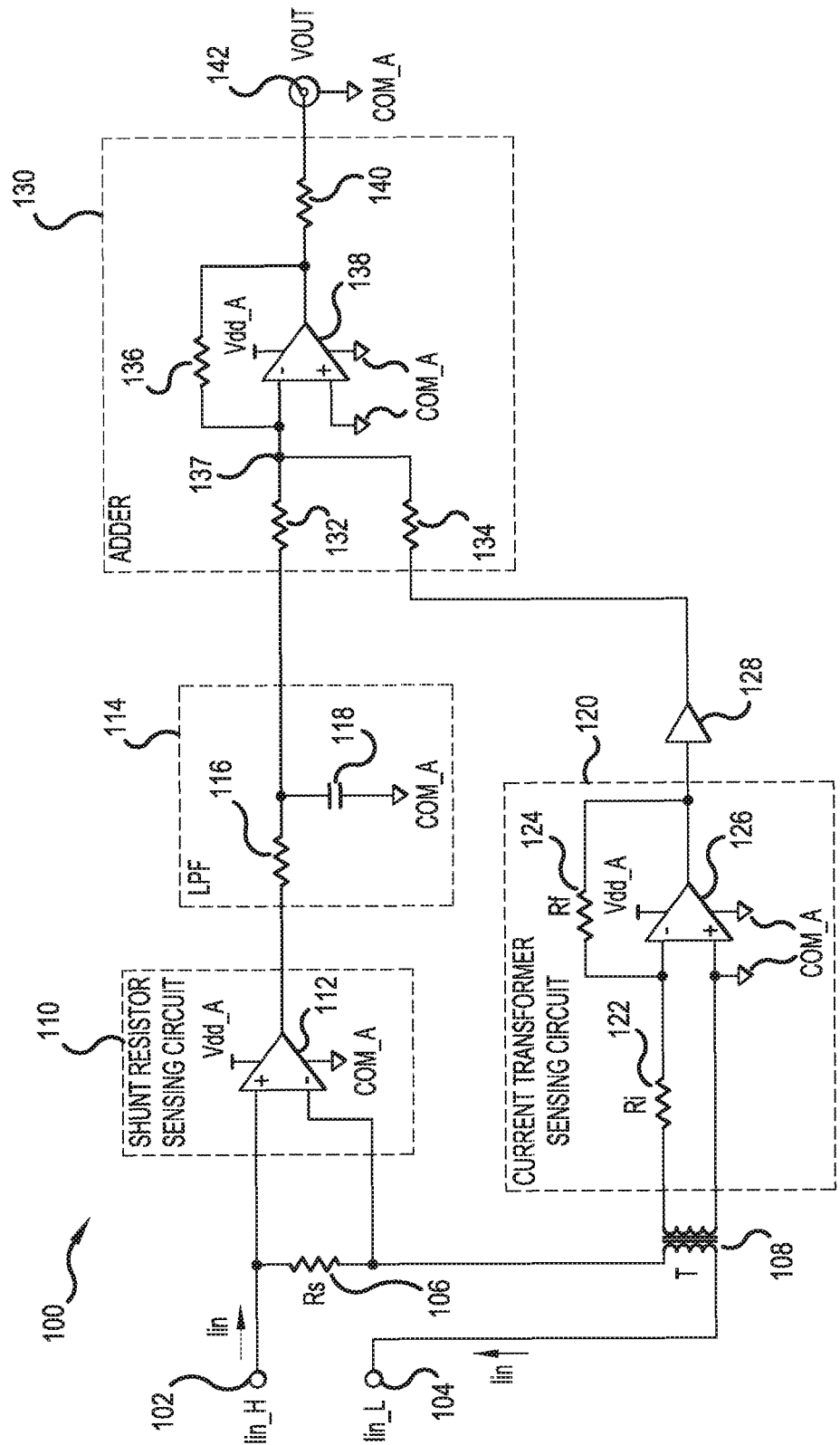
FIG. 1 is a block diagram of a current sensing circuit, according to a representative first embodiment.

In the following detailed description, for purposes of explanation and not limitation, illustrative embodiments disclosing specific details are set forth in order to provide a thorough understanding of embodiments according to the present teachings. However, it will be apparent to one having had the benefit of the present disclosure that other embodiments according to the present teachings that depart from the specific details disclosed herein remain within the scope of the appended claims. Moreover, descriptions of well-known devices and methods may be omitted so as not to obscure the description of the example embodiments. Such methods and devices are within the scope of the present teachings. Generally, it is understood that the drawings and the various elements depicted therein are not drawn to scale.

The various embodiments of the disclosure generally relate to low-noise and wide-range current sensing circuits. That is, according to various embodiments, a current sensing circuit has a low current noise performance, e.g., as low as about 1 μA level to allow for observations on the order of 1 μA which is necessary for current measurement at least in a range of about 1 μA to about 200 mA; a wide and flat frequency response over a range from DC to at least about 100 MHz; fast response characteristics capable of tracking a current change that takes less than about 1 μs when the current sensing circuit is connected to a measurement circuit of a DUT and a capacitance pertaining to the measurement circuit is taken into account; a high input impedance for high-side current sensing in order to detect failures and measure leaks in the DUT effectively; and a wide dynamic range that allows for the measurement of a current change by five digits or more from about 1 μA, which is necessary for current measurement at least in a range of about 1 μA to about 200 mA.

Some conventional current sensing circuits use a magnetic field sensor, such as a Hall-effect sensor, which is only capable of sensing large currents due to lack of a high sensitivity sensor. Other conventional current sensing circuits use a shunt resistor having a shunt resistance (Rs). In this case, when a large resistance is used in an attempt to obtain sufficient sensitivity, the current waveform is rendered blunt by bypass capacitors in the DUT measurement circuit and the shunt resistance, as discussed above. When using a small shunt resistance, it is also problematic when a voltage appearing between the ends of the shunt resistor becomes too small for operating a differential amplifier (in terms of performance limitations, especially signal to noise ratio (S/N) performance). For example, when using a 10Ω resistor, a current waveform that is intended to be measured cannot be captured with high fidelity due to the large valued resistance. In order to capture a current that shifts within 1 μs or less, the time constant needs to be kept, as a rough indication, less than the current shifting time at least, and a tolerable shunt resistance for the shunt resistor may become as small as 0.66Ω (e.g., 1 μs/1.5 μF=0.66Ω), or less. The requirement for the shunt resistance (Rs) may be indicated by Expression (1), as follows:

$$Rs < \tau_{BLE}/C_{byp} \quad (1)$$

In Expression (1), $C_{byp}$ is the total capacitance [F] of the bypass capacitors of the measurement circuit, and $\tau_{BLE}$ is the time constant [sec.] of the measurement circuit necessary to obtain a high fidelity waveform.

In order to accomplish current measurement on the order of 1 μA, a shunt resistance is chosen that is appropriate from the viewpoint of the S/N performance of a current sensing amplifier. With this as a clue, a current sensing circuit configuration and a current sensing method have been determined that solve multiple problems and that may satisfactorily measure conventional devices employing the BLE protocol, for example, by having a low noise performance, a wide bandwidth, a wide dynamic range from about 1 μA and up, and fast response characteristics that enable tracking a signal change that occurs on the order of about 1 μs or less.

According to various embodiments, current is sensed according to a method that involves two circuits, one of which senses current flowing through a shunt resistor and the other of which senses current using a current transformer (CT). A low pass filter having a cutoff frequency of fc is provided at an output of the sensing circuit of the shunt resistor, and an input resistor is further provided in series connection to the secondary side of the CT, as a bridging component to an inverting input terminal of a transimpedance amplifier. Various embodiments also obtain an optimum ratio of shunt resistance Rs and input resistance Ri by analyzing total noise of the current sensing circuit, in the manner that the selected resistance values minimize the sum of noise in the low frequency range operation of the two circuits that uses the shunt resistor and that uses the CT. The current sensing circuit accomplishes current measurement on the order of 1 μA. An adder that combines the output of the shunt resistor-type current sensing circuit and the output of the CT-type current sensing circuit also may be provided in the current sensing circuit. The various embodiments are discussed below.

FIG. 1 is a block diagram of a current sensing circuit, according to a representative first embodiment. Referring to FIG. 1, a current sensing circuit 100 includes a shunt resistor sensing circuit 110, a low pass filter (LPF) 114, a current transformer (CT) sensing circuit 120, and an adder 130. The current sensing circuit 100 further includes a shunt resistor 106 and a current transformer (CT) 108, such that an input current Iin from a DUT (not shown) flows into the current sensing circuit 100 between input terminal Iin_H 102 and input terminal Iin_L 104 via the shunt resistor 106 and a primary-side winding of the CT 108.

The maximum allowable shunt resistance Rs of the shunt resistor 106 is determined by the requirement that the time constant and the capacitors of the DUT circuit be small enough to be able to observe current draw changes, as indicated by Expression (1), discussed above, where $\tau_{BLE}$ is the time constant of the current sensing circuit 100, for example, and $C_{byp}$ is the total capacitance of bypass capacitors between a power supply rail of the DUT and GND. In the above example, $\tau_{BLE}$ is 1 μs and $C_{byp}$ is 1.5 μF, which make the maximum value of shunt resistance Rs 0.66Ω. While a larger shunt resistance Rs may work better with higher S/N sensing, it may also raise another design challenge, such as the need for a special cooling mechanism for Joule heating in the shunt resistor 106, in addition to the time constant $\tau_{BLE}$ restraint.

The minimum allowable value of shunt resistance Rs is determined to be about 0.03Ω in terms of cost and accuracy design of the current sensing circuit 100, as described below. In case of a lower value of shunt resistance Rs, the voltage between the two terminals of the shunt resistor 106 becomes too small when a current as low as 1 μA flows. The voltage needs to be amplified to a level on the order of 1 V for analog-to-digital conversion. Because what is attempted here is to measure the low current on the order of μA at a range of around 1 mA full scale, when this voltage is too small, the amplifier gain should be excessively large, thereby necessitating multiple high gain stages. This makes it difficult to implement the current sensing circuit 100 in terms of cost. For example, when the shunt resistance Rs of the shunt resistor Rs 106 is less than about 0.03Ω, the amplifier needs to have a gain of 1 V/(1 mA*Rs)=3.33*10$^4$, which is well over 10,000 times. Although this is possible to achieve, it imposes a heavy burden on circuit design in terms of cost and other matters. In addition, offset error and the like of the first-stage amplifier are amplified at a very high gain, making it difficult to maintain precision of the current measurement. In short, the shunt resistance Rs is desirably selected within a range from about 0.03Ω to about $\tau_{BLE}/C_{byp}$Ω. Setting the shunt resistance Rs of the shunt resistor 106 within this range enables current sensing from about 1 µA to about 200 mA.

As stated above, the shunt resistor sensing circuit 110 is connected between the two terminals of the shunt resistor 106, and the LPF 114, having a cutoff frequency fc, is connected to the output of the shunt resistor sensing circuit 110. In the first embodiment, the shunt resistor sensing circuit 110 includes a differential amplifier 112, including power supply terminal Vdd_A and analog ground terminal COM_A connected to the amplifier 112. The terminals of the shunt resistor 106 are connected across the non-inverting and inverting terminals of the amplifier 112. The analog ground terminal COM_A may supply a common potential, which may be the same electric potential as a chassis potential in a current sensing instrument, or a ground potential, for example. The LPF 114 includes a resistor 116 and a capacitor 118. The resistor 116 is connected in series with an output terminal of the amplifier 112, and the capacitor 118 is connected between an output terminal of the resistor 116 and the analog ground terminal COM_A.

The CT sensing circuit 120 is connected to a secondary-side winding of the CT 108. A gain adjustment amplifier 128 is connected to the output of the CT sensing circuit 120 for gain adjustment. The CT sensing circuit 120 includes an input resistor 122 with resistance Ri, a CT output sensing amplifier 126, and a feedback resistor 124 with resistance Rf. The input resistor 122 is connected in series between the non-ground side of the secondary-side winding of the CT 108 and an inverting input terminal of the CT output sensing amplifier 126. The feedback resistor 124 is connected between the output terminal of the CT output sensing amplifier 126 and the non-inverting input terminal of the CT output sensing amplifier 126. The CT output sensing amplifier 126 and the feedback resistor 124 thereby form a transimpedance amplifier in this manner. The power supply terminal Vdd_A and the analog ground terminal COM_A are further connected to the CT output sensing amplifier 126. The ground side of the secondary-side winding of the CT 108 is connected to the analog ground terminal COM_A and to the non-inverting input terminal of the CT output sensing amplifier 126. Although not shown, the power supply terminal Vdd_A and the analog ground terminal COM_A are connected to the gain adjustment amplifier 128 as well.

Providing the input resistor 122 provides advantages over connecting the secondary-side winding of the CT 108 directly to the transimpedance amplifier (CT output sensing amplifier 126 and the feedback resistor 124). That is, if the CT 108 were connected directly, a low impedance is connected to the transimpedance amplifier's input because the impedance between terminals of the secondary-side winding of the CT 108 is close to 0Ω at DC. When such a low impedance (temporarily referred to as Zsmall) is connected to the inverting input terminal of the CT output sensing amplifier 126, a noise gain G thereof is determined by the smaller of 1+Rf/Zsmall or an open loop gain of the CT output sensing amplifier 126 (e.g., around 10$^6$ at worst). The DC output of CT output sensing amplifier 126 is G times the DC offset voltage thereof, and the CT output sensing amplifier 126 is likely to saturate and unlikely to operate soundly. Therefore, saturation of the CT output sensing amplifier 126 may be prevented by connecting the CT 108 and the transimpedance amplifier via the input resistor 122 that has an appropriate resistance Ri.

In the drawings, a power supply terminal of each of the various amplifiers (e.g., differential amplifier 112 and CT output sensing amplifier 126) is illustrated as a unipolar power supply terminal simplification. However, it is understood that the power supply terminal may be a pair of bipolar power supply terminals having a positive pole terminal and a negative pole terminal in practice, for example, without departing from the scope of the present teachings. In an embodiment, the CT output sensing amplifier 126 in the CT sensing circuit 120, which determines high frequency-side performance, is implemented to have a wide bandwidth of at least about 100 MHz. However, the band width of the CT output sensing amplifier 126 is not limited thereto.

The output of the LPF 114 (related to the shunt resistor sensing circuit 110) and the output of the gain adjustment amplifier 128 related to the CT sensing circuit 120 are summed or added together by the adder 130. The sum is output from the adder 130 to an output terminal 142 of the current sensing circuit 100. In order to lead this output of the current sensing circuit 120 to the outside, the output terminal 142 may be connected to the center conductor of a coaxial cable, for example, with an outer conductor of the coaxial cable connected to the analog ground terminal COM_A, as indicated in FIG. 1. The output terminal 142 is connected to an analog-to-digital converter (ADC) (not shown) to obtain a measured current value through given data processing.

The adder 130 includes resistors 132 and 134, a summing amplifier 138, feedback resistor 136 and an output resistor 140. The resistor 132 is connected in series between the output of the LPF 114 and an inverting input of the summing amplifier 138, and the resistor 134 is connected in series between the output of the gain adjustment amplifier 128 and the inverting input of the summing amplifier 138. The feedback resistor 136 is connected to a summing node 137 of the resistors 132 and 134 (that is, the inverting input terminal of the CT output sensing amplifier 126) and the output terminal of the summing amplifier 138. The summing amplifier 138 is connected to the power supply terminal Vdd_A and the analog ground terminal COM_A, and a non-inverting input terminal of the summing amplifier 138 is connected to the analog ground terminal COM_A. The output resistor 140, connected in series between the output terminal of the summing amplifier 138 and the output terminal 142 of the current sensing circuit 100, is configured to match impedance with the coaxial cable connected externally to the output terminal 142.

In the configuration shown in FIG. 1, the current sensing circuit 100 operates so as to output mainly signals from the shunt resistor sensing circuit 110 via the LPF 114 in a low frequency range (DC through the cutoff frequency fc of the LPF 114), and to output mainly signals from the CT sensing circuit 120 via the gain adjustment amplifier 128 in a high frequency range (above the cutoff frequency fc). Thus, the low frequency-side cutoff frequency of the CT 108 has the same cutoff frequency fc of the LPF 114. Also, a flat portion of the frequency response of the LPF 114 output has substantially the same level as that of the gain adjustment amplifier 128. Having the same cutoff frequencies and the same flat portion of the frequency responses leads to a flat frequency response of the output of the current sensing circuit 100 from DC to high frequencies in an optimum form, and makes it possible to obtain an optimum solution that minimizes measurement noise, as described below. The above mentioned low frequency-side cutoff frequency of the CT sensing circuit 120 is determined by selection of magnetic core material used in the CT 108.

Figure 2:
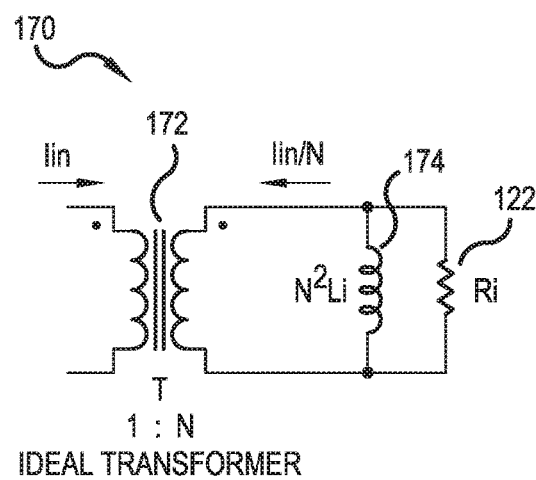
FIG. 2 is a circuit diagram of a partial equivalent circuit of the current sensing circuit of FIG. 1.

FIG. 2 is a circuit diagram of a partial equivalent circuit of the current sensing circuit of FIG. 1, according to a representative embodiment. More particularly, FIG. 2 is a diagram illustrating an equivalent circuit of the CT 108 referred to the secondary side, with the input resistor 122 equivalently seen as shunting the secondary side of the CT 108, as the input impedance from the inverting input terminal of the CT output sensing amplifier 126 to ground is regarded as zero. The CT 108 is illustrated in FIG. 2 as an ideal current transformer 172 with a turns ratio of 1:N. When the current Iin flows into the primary side, a current of Iin/N flows out of the secondary side. An inductor 174, having an inductance of $N^2*Li$, and the input resistor 122 are connected in parallel between secondary-side terminals of the ideal current transformer 172, where Li is the primary-side magnetizing inductance of the ideal current transformer 172. It is understood from FIG. 2 that the lower cutoff frequency fc of the CT 108 may be determined in accordance with Expression (2):

$$fc=Ri/(2*\pi*N^2*Li) \quad (2)$$

Root mean square noise (RMS noise) of the current measurement over the entire frequency range of the current sensing circuit 100 is examined next. More particularly, the noise on the shunt resistor sensing circuit 110 is determined by the input referred noise and the bandwidth (equivalently, the cutoff frequency fc of the LPF 114) of the amplifier 112 that senses the shunt resistance Rs of the shunt resistor 106. The noise on the CT sensing circuit 120 is the sum of a noise contribution of the CT output sensing amplifier 126, which is present at frequencies equal to and below the cutoff frequency fc where the CT 108 does not operate, and noise contribution at frequencies above the cutoff fc where the CT 108 operates.

Assuming that an input referred voltage noise spectral density en_inst of the differential amplifier 112 is frequency-independent, current measurement noise In_shunt in the shunt resistor 106 sensing is indicated by Expression (3):

$$In\_shunt=en\_inst*\sqrt{((\pi/2)*fc)}/Rs \quad (3)$$

In Expression (3), Rs represents the resistance of the shunt resistor 106, and a factor π/2 is a noise bandwidth coefficient of a primary low pass filter.

CT-side noise at a frequency equal to or below the cutoff frequency fc is determined by the noise gain of the CT output sensing amplifier 126, and is provided by Expression (4):

$$In\_ct=en\_ct*(1+Rf/Ri)*\sqrt{((\pi/2)*fc)}*N/Rf \approx en\_ct* \\ \sqrt{((\pi/2)*fc)}*N/Ri \quad (4)$$

In Expression (4), Rf represents the resistance of the feedback resistor 124 of the CT output sensing amplifier 126, and en_ct represents the input referred voltage noise spectral density of the CT output sensing amplifier 126. Expression (4) is simplified by selecting a resistance ratio Rf/Ri>>1, which is usually satisfied.

Notably, the CT-side noise contribution in a high-frequency range above the cutoff frequency fc, on the other hand, is independent of the input resistor 122 (resistance Ri), and is therefore excluded from the noise calculation.

The square of total noise in a frequency range lower than the cutoff frequency fc is accordingly calculated according to Expression (5):

$$In\_ttl^2=In\_shunt^2+In\_ct^2=((en\_inst^2/Rs^2)*Ri+en\_ct^{2*} \\ (N^2/Ri))/(4*N^2*Li) \quad (5)$$

Expression (5) indicates that there exists an optimum solution for resistance Ri that minimizes the square of total noise. This solution is obtained when Ri satisfies the Expression (6):

$$Ri\_min=(en\_ct/en\_inst)*N*Rs \quad (6)$$

Figure 3:
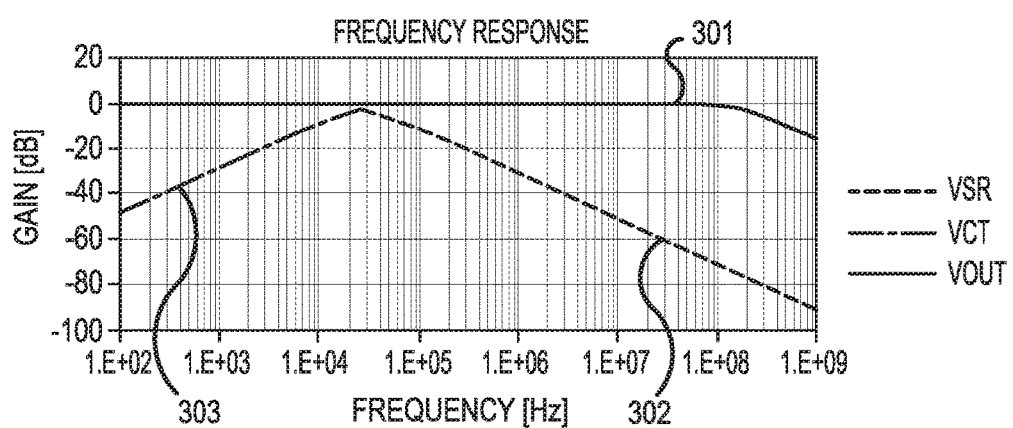
FIG. 3 is a graph showing simulation results of frequency response characteristics of the current sensing circuit of FIG. 1.

FIG. 3 is a graph showing simulation results of frequency response characteristics of the current sensing circuit of FIG. 1. More particularly, trace 301 in FIG. 3 shows simulation results of VOUT (voltage at the output terminal 142) with the shunt resistor sensing circuit 110 and the CT sensing circuit 120 having the fc cutoff frequency expressed by Expression (2) for a flat frequency response from about 100 Hz to about 100 MHz, as well as selecting the optimum resistance Ri of Expression (6) for the resistance Rs of the shunt resistor 106. Trace 302 shows VSR, which represents the frequency characteristics of output signals of the LPF 114, and trace 303 shows VCT, which represents the frequency characteristics of output signals of the gain adjustment amplifier 128.

Figure 9:
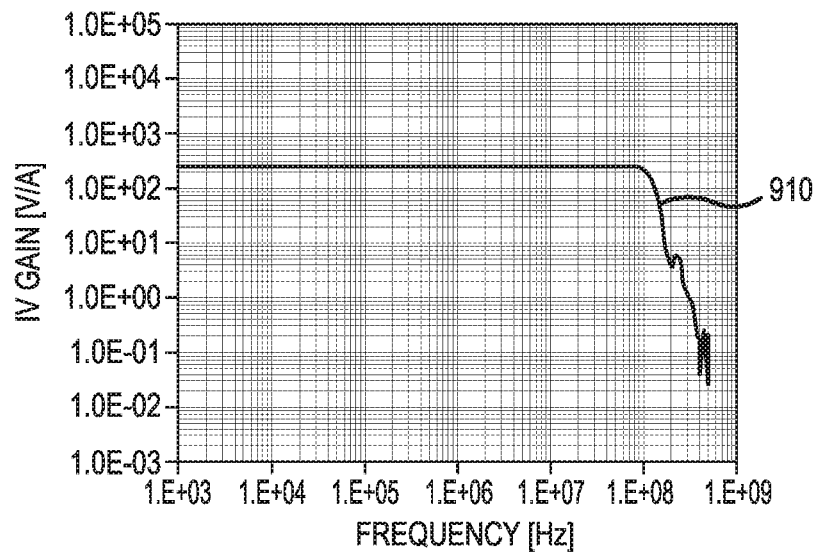
FIG. 9 is a graph showing measurement results of the current sensing circuit of FIG. 1.
Figure 10:
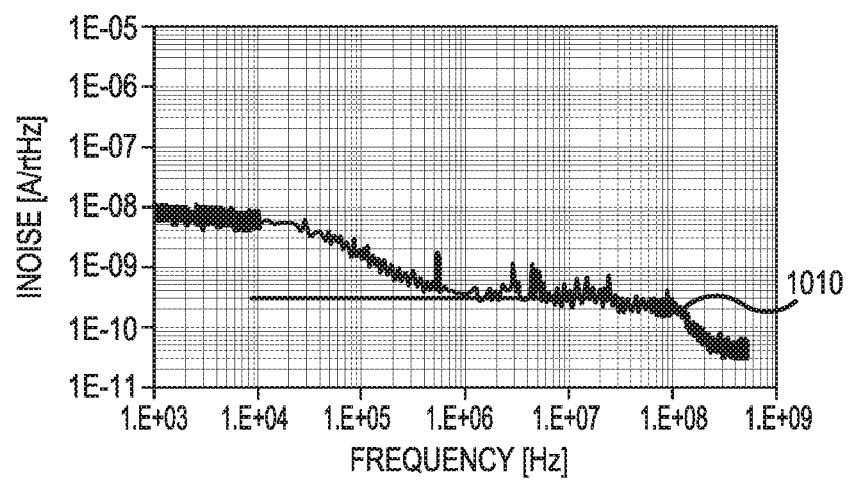
FIG. 10 is a graph showing actual measurement values of frequency characteristics at a current noise spectral density converted into a measured current in the current sensing circuit of FIG. 1.

FIG. 9 is a graph showing measurement results of the current sensing circuit of FIG. 1, and FIG. 10 is a graph showing actual measurement values of frequency characteristics at a current noise spectral density converted into a measured current in the current sensing circuit of FIG. 1.

More particularly, as a design case, FIG. 9 shows an actual measurement result of the frequency characteristic of the current sensing circuit 100, according to the representative first embodiment, which is measured at a current measurement range of 2 mA full scale with the shunt resistance of 0.25Ω. The performance shown by trace 910 in FIG. 9 has a current-to-voltage conversion gain of 250 V/A and a 3 dB bandwidth of 115 MHz. Trace 1010 in FIG. 10 shows the measurement result of current noise spectral density referred to the measured input current for the above case. The measured RMS noise in a 20 MHz range is about 2.2 µA, and therefore an S/N ratio as high as about 1,000 is obtained relative to 2 mA range full scale. The current sensing circuit 100 is thus capable of covering a very low current range for a wide frequency range current sensor.

The noise floor in a high frequency range, particularly from about 1 MHz to about 20 MHz, is important for current sensors that observe fast waveforms shifting in 1 µs or less. It can be seen in FIG. 10 that the noise floor in this frequency range is approximately 300 pA/√Hz. If the same level of noise performance as shown in FIG. 10 is to be obtained simply by combining a shunt resistor and a differential amplifier, the differential amplifier needs to have an input referred voltage noise spectral density that is calculated according to Expression (7):

$$300 \text{ pA}/\sqrt{Hz}*0.25\Omega=75 \text{ pV}/\sqrt{Hz} \quad (7)$$

Considering that the noise performance of commercially available high performance differential amplifiers is about 1,000 pV/√Hz at best, the high quality of the noise performance of the illustrative current sensing circuit 100 is apparent.

In this manner, low noise performance on the order of single-digit µA is accomplished in a current sensor of which the frequency characteristics are flat over a wide frequency range, despite use of a shunt resistance Rs as small as about 0.66Ω or less. This small shunt resistance Rs enables the current sensing circuit 100 to avoid causing current waveform blunt due to the effect of the shunt resistor and bypass capacitors, and to acquire fast tracking properties capable of dealing with a signal of about 1 μs or less, while covering a measurement range of about five digits from 1 μA.

The current sensing circuit 100, which uses high-side current monitoring in the shunt resistor sensing circuit 110, may connect a conventional power supply, e.g., compatible with BLE standards, directly to the input terminal Iin_H 102 or the input terminal Iin_L 104, and therefore has an additional advantage over the conventional current sensors when a measurement circuit is formed.

The adder 130 may be implemented as an analog adder as described above. Alternatively, the adder may be a digital adder, in which ADCs are installed at the two inputs of the adder 130. Also, the LPF 114 is not limited to the configuration of FIG. 1. The LPF 114 may alternatively be configured as a digital LPF, instead of as an analog LPF, as illustrated in FIG. 1. The LPF 114 in this case includes an ADC located at the stage succeeding the shunt resistor sensing circuit 110, and its arithmetic circuit that functions as an LPF in a digitized manner. The adder 130 may be a digital adder in this case, configured such that one of the two inputs of the adder 130 receives a digital output from the LPF. Another ADC is provided at the stage succeeding the CT sensing circuit 120 via the gain adjustment amplifier 128 as the other input to the adder 130. The converted digital data is added to the input from the LPF 114 in addition processing. Also, in various configurations, the current sensing range of the current sensing circuit 100 is not necessarily limited to from 1 μA to 200 mA, and may be extended further.

Figure 4:
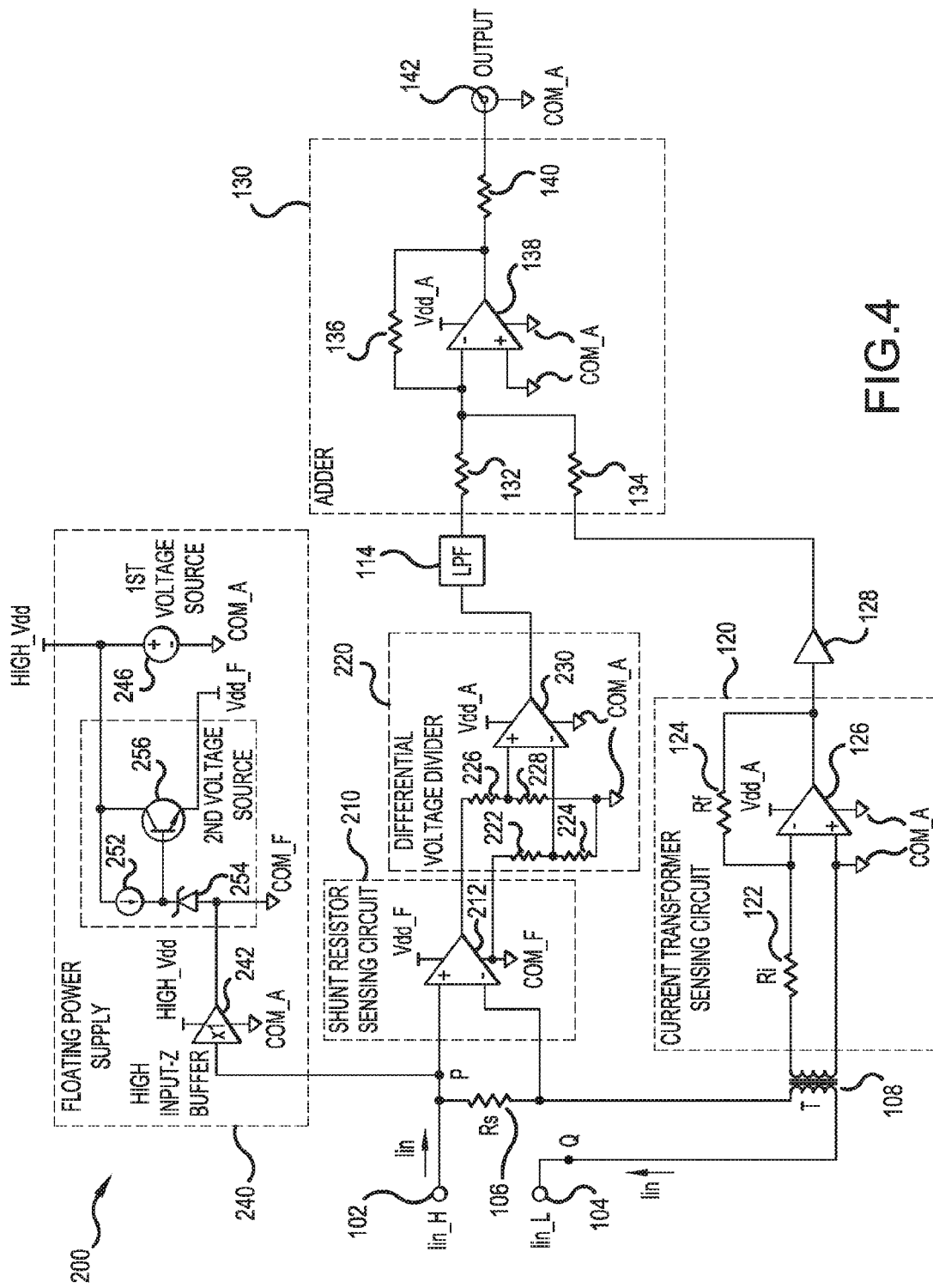
FIG. 4 is a block diagram of a current sensing circuit, according to a representative second embodiment.

FIG. 4 is a block diagram of a current sensing circuit, according to a representative second embodiment. Referring to FIG. 4, a current sensing circuit 200 differs from the current sensing circuit 100, at least in part, in that it further includes a floating power supply 240 and a differential voltage divider 220. A ground potential has an analog ground potential and a floating ground potential, and a power supply voltage of an amplifier also has an analog power supply voltage and a floating power supply voltage. the current sensing circuit 200 also includes a shunt resistor sensing circuit 210 having a differential amplifier 212 that are substantially the same as the shunt resistor sensing circuit 110 and the corresponding differential amplifier 112 shown in FIG. 1.

More specifically, the floating power supply 240, which generates an electric potential of a floating ground terminal COM_F and a voltage of a floating power supply terminal Vdd_F, is connected to a point P. The point P has the same electric potential as that of a terminal of the shunt resistor 106 that is on the input terminal Iin_H 102 side.

In the floating power supply 240, an electric potential at the input end of the shunt resistor 106 is buffered at the first stage as the electric potential of the floating ground terminal COM_F. A Zener diode 254 or the like adds a fixed voltage to (or subtracts a fixed voltage from) the electric potential of the floating ground terminal COM_F, and the resultant electric potential is used to generate the voltage of the floating power supply voltage terminal Vdd_F. When the voltage of the Zener diode is given as Vz, the voltage of the floating power supply voltage terminal Vdd_F is provided by Expression (8):

$$Vdd\_F = COM\_F + Vz - 0.7 [V] \quad (8)$$

Referring to Expression (8), Vdd_F is the floating power supply voltage and COM_F is the floating ground potential. A change in a common potential Vin of the shunt resistor 106 is accompanied by a change in the floating ground potential COM_F, thereby changing the floating power supply voltage Vdd_F as well. Consequently, the input voltage range of the amplifier 212 in the shunt resistor sensing circuit 210, operated by the floating power supply voltage Vdd_F, is automatically adjusted so that Vin is always within the input voltage range.

A voltage of a high power supply voltage terminal High_Vdd is a significantly higher voltage (e.g., 50 V) than the power supply voltage of an operational amplifier, which is usually about 15V or less.

In more detail, the floating power supply 240 further includes a high-input impedance buffer 242, a first voltage source 246, a current source 252, a second voltage source 244, and a transistor 256. The first voltage source 246 generates the voltage of the high power supply voltage terminal High_Vdd, referenced to the electric potential of the analog ground terminal COM_A. A signal from the point P is input to the high-input impedance buffer 242, and the power supply for the high-input impedance buffer 242 is the voltage of the terminal High_Vdd referenced to the ground terminal COM_A. The high-input impedance buffer 242 buffers the electric potential of the point P and outputs the buffered electric potential. The floating power supply 240 viewed from the point P has a high impedance.

The second voltage source 244 is connected to the output of the high-input impedance buffer 242 and the high power supply voltage terminal High_Vdd. Referring to FIG. 4, the second voltage source 244 generates the voltage of the floating power supply voltage terminal Vdd_F referenced to the electric potential of the floating ground terminal COM_F, i.e., the buffered electric potential of the high-input impedance buffer 242. Specifically, the second voltage source 244 may include the transistor 256, the Zener diode 254, and the current source 252 as illustrated in the example of FIG. 4. The current source 252 provides a bias current for the Zener diode 254 to build up a fixed Zener voltage on it. Referring to the transistor 256, the base terminal is connected to the cathode terminal of the Zener diode 254, the collector terminal is connected to the High_Vdd, and the emitter terminal is connected to the floating power supply terminal Vdd_F as the output of the second voltage source 244, in which the transistor 256 works as an emitter follower. However, the second voltage source 244 is not limited to this configuration.

The second voltage source 244 thus uses an electric potential of COM_F, substantially equal to that of the point P, as an input, and outputs a power supply voltage that has a given electric potential difference from that of COM_F as the voltage of Vdd_F, providing a power supply in the shunt resistor sensing circuit 210. The shunt resistor sensing circuit 210, which senses a voltage between the two terminals of the shunt resistor 106, includes the differential amplifier 212. The voltage of Vdd_F and the electric potential of COM_F prepared by the floating power supply 240 are supplied to the amplifier 212. This enables the shunt resistor sensing circuit 210 to deal with a voltage change around the electric potential of the point P, which serves as a reference to that of COM_F.

The differential voltage divider 220 includes resistors 222, 224, 226 and 228, and a differential amplifier 230. The differential voltage divider 220 is configured to sense the output of the amplifier 212 operating at the floating potential (e.g., in a 50 V range), converting the output voltage of the amplifier 212 referenced to the electric potential of COM_F into a divided voltage referenced to the electric potential of the analog ground terminal COM_A at a fixed dividing ratio. Thus, the voltage divider 220 prevents an input voltage of the differential amplifier 230 from being excessively large.

The output voltage of the shunt resistor sensing circuit 210 and the electric potential of the floating ground terminal COM_F are divided at the resistances of resistors 222 to 228 into voltages referenced to the electric potential of the analog ground terminal COM_A, and the voltages are output to the LPF 114 via the differential amplifier 230. The analog power supply voltage of the analog power supply terminal Vdd_A and the electric potential of the analog ground terminal COM_A are supplied to the differential amplifier 230. The signal transmission following the voltage divider of the current sensing circuit 200 is substantially the same as that of the current sensing circuit 100, discussed above.

Isolation impedance to isolate a circuit on the DUT side and a circuit inside the current sensing circuit 200 from each other may be maintained high (e.g., over about 100 MΩ at the DC) by employing a high-input impedance amplifier such as a JFET amplifier or a CMOS amplifier in the high-input impedance buffer 242.

The remaining configuration of the current sensing circuit 200 is substantially the same as that of the current sensing circuit 100, and description thereof is omitted. In particular, the CT side where the primary-side electric potential is separate from the secondary-side electric potential does not need a special circuit element that is used to accommodate the electric potential difference, such as the voltage divider described above. The optimum resistance of the input resistor 122 may be obtained by the method described with respect to the current sensing circuit 100.

The thus configured current sensing circuit 200, which is high in impedance when viewed from the DUT, is even less invasive and may accordingly avoid changes in the operating point of the DUT, which may be otherwise caused by connecting the current sensing circuit 200 to the DUT. The current sensing circuit 200 may also deal with a high electric potential that is input to the amplifier 212 of the shunt resistor sensing circuit 210 as follows. That is, when an input voltage to the amplifier 212 of the shunt resistor sensing circuit 210 exceeds a normal power supply voltage range of operational amplifiers (approximately ±15 V), the current sensing circuit 200 may follow the voltage without breaking the amplifier 212 of the shunt resistor sensing circuit 210 because the ground potential and power supply voltage supplied to the amplifier 212 are the electric potential of the floating ground terminal COM_F and the voltage of the floating power supply terminal Vdd_F, respectively, which are generated by the floating power supply 240 between the input voltage, i.e., the electric potential of the point P, and that of the high power supply voltage terminal High_Vdd.

The shunt resistor sensing circuit 210 is thus given high impedance at the input end and may also deal with a high electric potential that is input to the shunt resistor sensing circuit 210. The floating power supply 240, which is shown connected to the point P in FIG. 4, may alternatively be connected to a point Q (connected to the input terminal Iin_L 104), without departing from the scope of the present teachings.

The alternative modes of implementing the functionality of the adder and/or the LPF, as well as the extensibility of the current sensing range, discussed above with reference to the first embodiment depicted in FIG. 1 also apply to the second embodiment depicted in FIG. 4.

Figure 5:
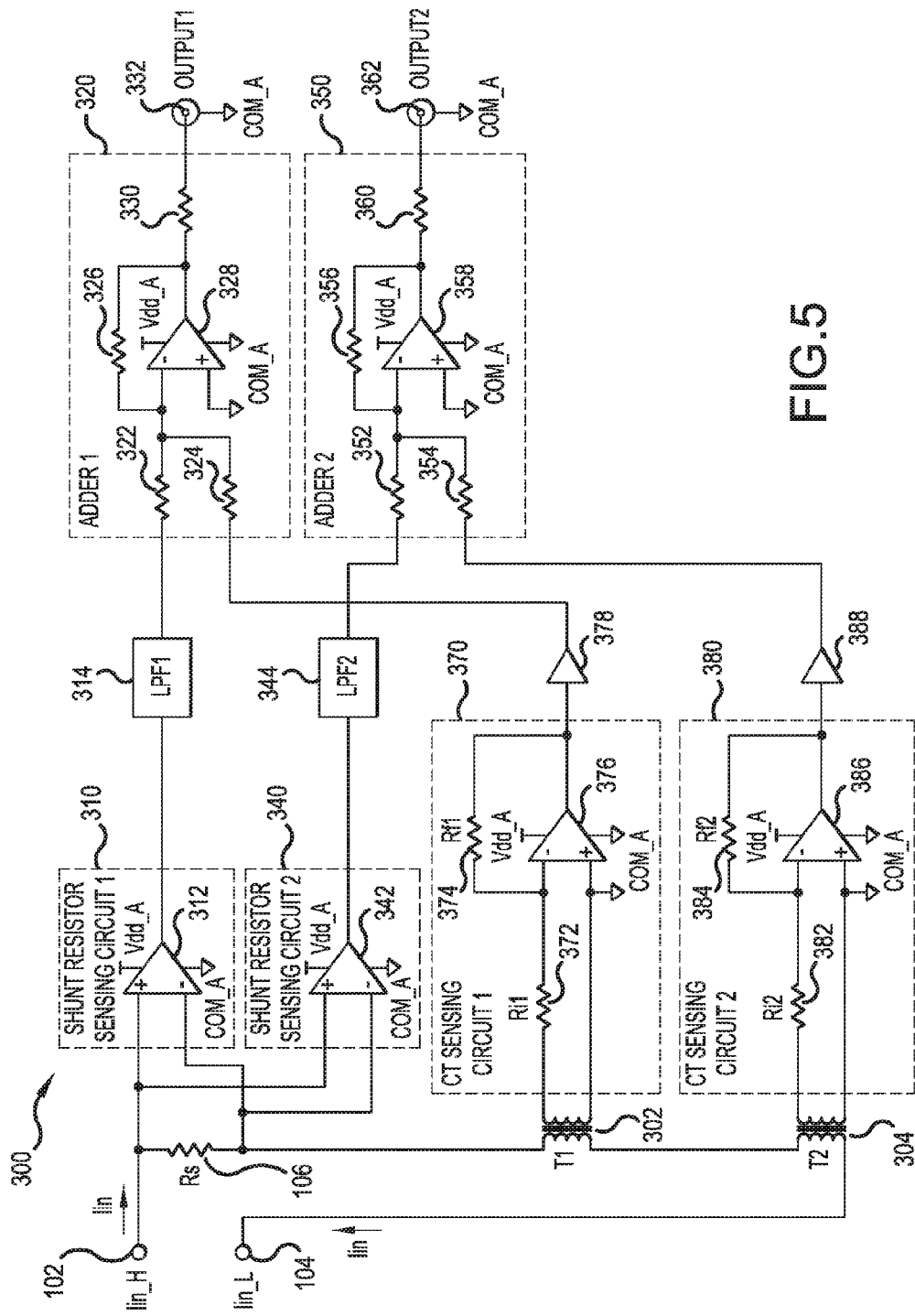
FIG. 5 is a block diagram of a current sensing circuit, according to a representative third embodiment.

FIG. 5 is a block diagram of a current sensing circuit, according to a representative third embodiment. Referring to FIG. 5, a current sensing circuit 300 is similar to the current sensing circuit 100, discussed above, but having two output terminals providing current sensing outputs in two ranges: first output terminal 332 for outputting first current sensing output Output1 and second output terminal 362 for outputting second current sensing output Output2.

Specifically, the current sensing circuit 300 outputs in two ranges by providing two shunt resistor sensing circuits, first and second shunt resistor sensing circuits 310 and 340, like the shunt resistor sensing circuit 110 shown in FIG. 1, and two CT sensing circuits, first and second CT sensing circuits 370 and 380, like the CT sensing circuit 120 shown in FIG. 1, for two ranges. The first and second shunt resistor sensing circuits 310 and 340 are related to the shunt resistor 106, and the first and second CT sensing circuits 370 and 380 are related to the first and second CTs 302 and 304, respectively. The current sensing circuit 300 also provides two adders, first and second adders 320 and 350, like the adder 130 of FIG. 1, for the two ranges.

The current Iin flows from the input terminal Iin_H 102 to the input terminal Iin_L 104 via the shunt resistor 106, the primary-side winding of a first CT 302, and the primary-side winding of the second CT 304. The first shunt resistor sensing circuit 310 for the first current range and the second shunt resistor sensing circuit 340 for the second current range are connected between the two ends of the shunt resistor 106. A first low pass filter (LPF) 314 having a cutoff frequency fc1 is connected to the output of the first shunt resistor sensing circuit 310 for the first current range, and a second LPF 344 having a cutoff frequency fc2 is connected to the output of the second shunt resistor sensing circuit 340 for the second current range.

The first shunt resistor sensing circuit 310 includes a first differential amplifier 312, and the second shunt resistor sensing circuit 340 includes a second differential amplifier 342. The power supply terminal Vdd_A and the analog ground terminal COM_A are each connected to both of the first and second differential amplifiers 312 and 342. The first and second LPFs 314 and 344 have the same configuration as that of the LPF 114 illustrated in FIG. 1, so the description therefore is omitted with reference to FIG. 5.

The first CT sensing circuit 370 is connected to the secondary-side winding of the first CT 302 for the first current range. A first gain adjustment amplifier 378 for gain adjustment is connected to the output of the first CT sensing circuit 370. On the non-ground side of the secondary-side winding of the first CT 302, a first input resistor 372 is connected in series with a first CT output sensing amplifier 376. The first CT output sensing amplifier 376 has an inverting input terminal to which the first input resistor 372 is connected, and a first feedback resistor 374 is connected between the output terminal and the inverting input terminal of the first CT output sensing amplifier 376. A transimpedance amplifier is thus formed from the first CT output sensing amplifier 376 and the first feedback resistor 374. The power supply terminal Vdd_A and the analog ground terminal COM_A are also connected to the first CT output sensing amplifier 376. The secondary-side winding of the first CT 302 is connected on the ground side to the analog ground terminal COM_A and a non-inverting input terminal of the first CT output sensing amplifier 376. The low frequency-side cutoff frequency of the first CT 302 is the same as the cutoff frequency fc1 of the first LPF 314.

The second CT sensing circuit 380 is connected to the secondary-side winding of the second CT 304 for the second current range. A second gain adjustment amplifier 388 for gain adjustment is connected to the output of the second CT sensing circuit 380. On the non-ground side of the secondary-side winding of the second CT 304, a second input resistor 382 is connected in series with the second CT output sensing amplifier 386. The second CT output sensing amplifier 386 has an inverting input terminal to which the second input resistor 382 is connected, and a second feedback resistor 384 is connected between the output terminal and the inverting input terminal of the second CT output sensing amplifier 386. A transimpedance amplifier is thus formed from the second CT output sensing amplifier 386 and the second feedback resistor 384. The power supply terminal Vdd_A and the analog ground terminal COM_A are also connected to the second CT output sensing amplifier 386. The secondary-side winding of the second CT 304 is connected on the ground side to the analog ground terminal COM_A and a non-inverting input terminal of the second CT output sensing amplifier 386. The low frequency-side cutoff frequency of the second CT 304 is the same as the cutoff frequency fc2 of the second LPF 344.

The output of the first LPF 314, related to the first shunt resistor sensing circuit 310 for the first current range, and the output of the first gain adjustment amplifier 378, related to the first CT sensing circuit 370, are added together by a first adder 320. The resulting sum is output to the first output terminal 332 for the first current range. The first output terminal 332 may be connected to the center conductor of a coaxial cable, with an outer conductor of the coaxial cable connected to the analog ground terminal COM_A.

The first adder 320 for the first current range includes a resistor 322, which is arranged in series with the output of the first LPF 314, and a resistor 324, which is arranged in series with the output of the first gain adjustment amplifier 378. The first adder 320 further includes a two-input first summing amplifier 328, which includes a first feedback resistor 326 connected to the resistors 322 and 324, and an impedance matching resistor 330, which is connected in series to the output of the first summing amplifier 328. The first summing amplifier 328 is connected to the power supply terminal Vdd_A and the analog ground terminal COM_A, and a non-inverting input terminal of the first summing amplifier 328 is connected to the analog ground terminal COM_A.

The output of the second LPF 344, related to the second shunt resistor sensing circuit 340 for the second current range, and the output of the second gain adjustment amplifier 388, related to the second CT sensing circuit 380, are added together by the second adder 350. The resulting sum is output to the second output terminal 362 for the second current range. The second output terminal 362 may be connected to the center conductor of a coaxial cable, with an outer conductor of the coaxial cable connected to the analog ground terminal COM_A.

The second adder 350 for the second current range includes a resistor 352, which is arranged in series to the output of the second LPF 344, a resistor 354, which is arranged in series to the output of the second gain adjustment amplifier 388. The second adder 350 further includes a two-input second summing amplifier 358, which includes a second feedback resistor 356 connected to the resistors 352 and 354, and an impedance matching resistor 360, which is connected in series to the output of the second summing amplifier 358. The second summing amplifier 358 is connected to the power supply terminal Vdd_A and the analog ground terminal COM_A, and a non-inverting input terminal of the second summing amplifier 358 is connected to the analog ground terminal COM_A.

Although not shown, a power supply terminal and a ground terminal are connected to each of the first and second gain adjustment amplifiers 378 and 388 as is the case for the gain adjustment amplifier 128 of FIG. 1.

The current sensing circuit 300 is configured so that the current-to-voltage conversion gain of the first shunt resistor sensing circuit 310 for the first current range differs from that of the second shunt resistor sensing circuit 340 for the second current range. Therefore, the current-to-voltage conversion gain of the first CT sensing circuit 370 for the first current range differs from that of the second CT sensing circuit 380 for the second current range.

Thus, in the third embodiment, current sensing outputs including two different current-to-voltage conversion gains are led respectively into two analog-to-digital converters at the same time for current waveform observation. This is advantageous particularly when the current sensing circuit is formed by performing analog-to-digital conversion on a current detected by a configuration that uses two ADCs, each having a dynamic range of four digits or less, and accordingly has a cost advantage (e.g., over a configuration that uses one expensive ADC having a dynamic range of five digits or more).

The first and second adders 320 and 350 of FIG. 5 may alternatively be digital adders in which an ADC is installed, as discussed above with reference to the adder 130 of FIG. 1. The optimum resistances Ri1 and Ri2 of the first and second input resistors 372 and 382 may be obtained by the method described above with reference to the first embodiment depicted in FIG. 1.

Figure 7:
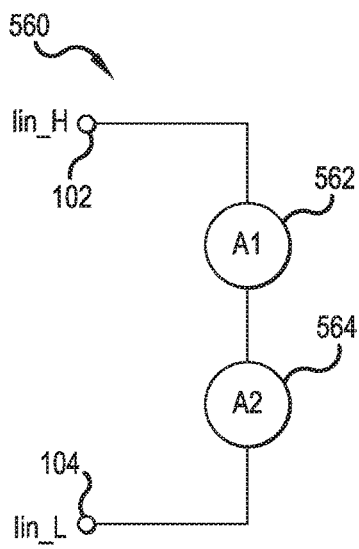
FIG. 7 is an equivalent block diagram illustrating operation of the current sensing circuit shown in FIG. 5.

FIG. 7 is an equivalent block diagram illustrating operation of the current sensing circuit 300 shown in FIG. 5. According to the thus configured third embodiment, a current measuring circuit 560 illustrated in FIG. 7 may be configured equivalently.

Referring to FIG. 7, two ampere meters, first and second ampere meters 562 (A1) and 564 (A2), are connected in series between the input terminals Iin_H 102 and Iin_L 104. When the first and second ampere meters 562 and 564 are, for example, a 200 mA-range ampere meter and a 2 mA-range ampere meter, respectively, a current from about 1 μA to about 200 mA may be measured with a simple configuration and by two ampere meters that complement each other through simultaneous measurement.

Figure 8:
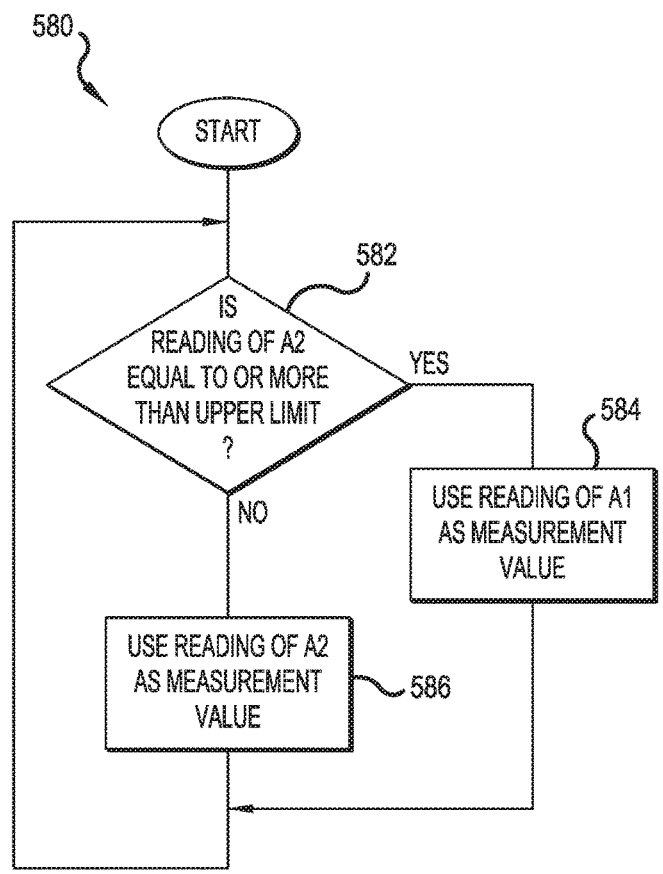
FIG. 8 is a flow chart for illustrating operation of the equivalent block diagram shown in FIG. 7.

Specifically, the current measuring circuit 560 uses a current measurement range determination algorithm (or method) 580, illustrated by the flow chart in FIG. 8, to measure current. It is assumed here that the current range of the second ampere meter 564 is lower in upper measurement limit than the current range of the first ampere meter 562.

Referring to FIG. 8, when current measurement begins, and the first and second ampere meters 562 and 564 start measuring a current simultaneously, it is determined in Step 582 whether the current reading by the second ampere meter 564, which has a low upper limit to the measurable current, is equal to or greater than the upper limit of the second ampere meter 564. When the result of the determination in Step 582 is "yes," the current measuring circuit 560 proceeds to Step 584 to use the reading of the reading of the first ampere meter 562, which has a high upper limit to the measurable current, as a measurement value. When the result of the determination in Step 582 is "no," the current measuring circuit 560 proceeds to Step 586 to use the reading of the second ampere meter 564, which has a low upper limit to the measurable current, as a measurement value. The current measuring circuit 560 thereafter repeats Step 582 and subsequent steps according to the determinations made in Step 582. In this manner, current may be measured over a wide dynamic range with a simple configuration using two ampere meters having current ranges different from each other. The number of current ranges used is not limited to two, and may be expanded to three or more, without departing from the scope of the present teachings.

The embodiment described above with reference to FIGS. 5, 7 and 8 is able to measure current changes on the order of about 1 µs. In comparison, the conventional current sensors cannot capture current changes which arise on the order of about 1 µs, as in a normal current measuring instrument having multiple current ranges, when the current range is switched from one range to another to suit the measurement signal. This is because the response time of the conventional current sensors for the waveform tracking is impacted by the length of the range switching time (e.g., about several tens of µs).

Examples of alternative modes of carrying out the adder and the LPF functions, as well as and the extensibility of the current sensing range in the first embodiment apply to the third embodiment, as well.

Figure 6:
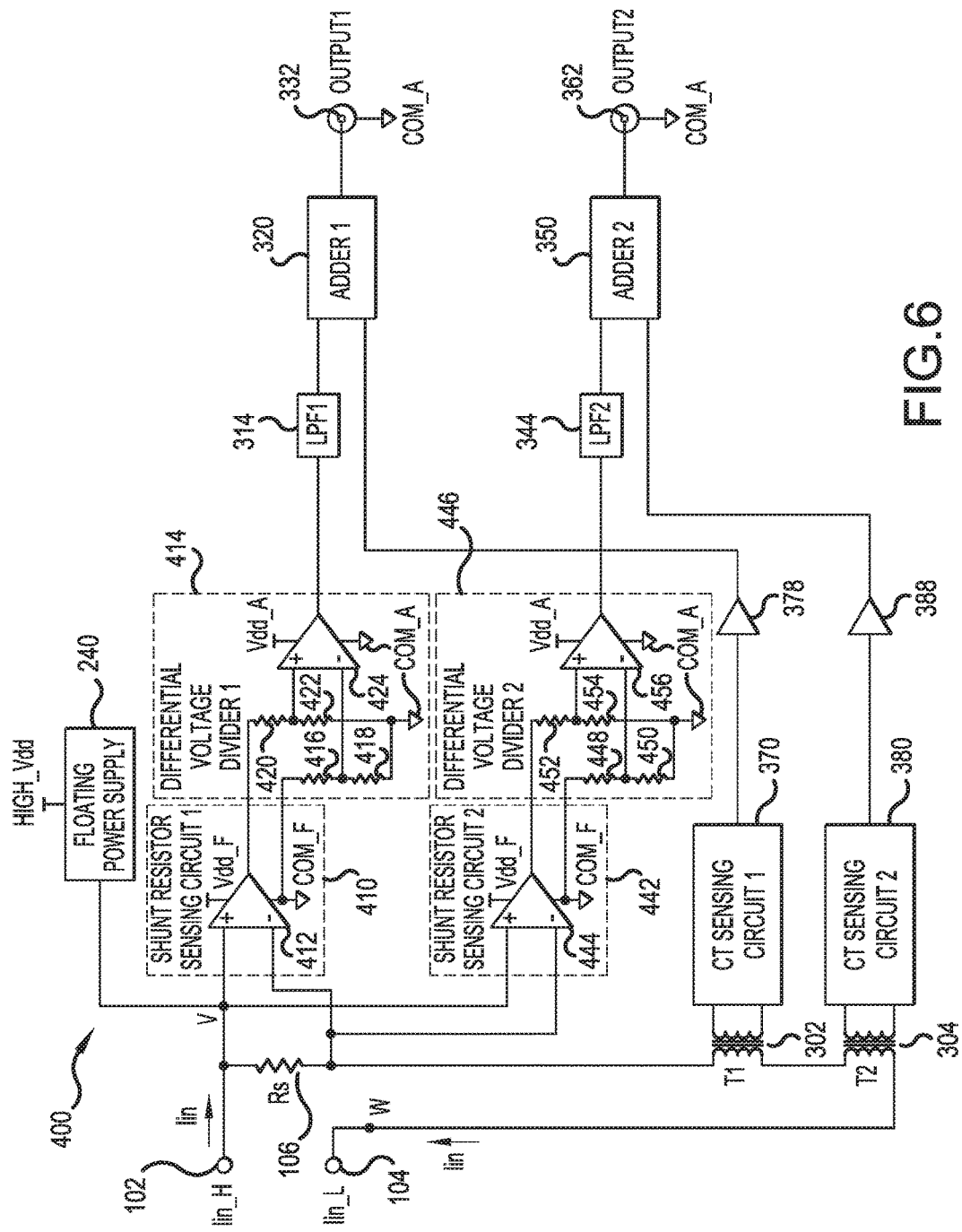
FIG. 6 is a block diagram of a current sensing circuit, according to a representative fourth embodiment.

FIG. 6 is a block diagram of a current sensing circuit, according to a representative fourth embodiment. Referring to FIG. 6, a current sensing circuit 400 essentially combines aspects of the current sensing circuit 200 and the current sensing circuit 300, discussed above.

Specifically, referring to FIG. 6, the floating power supply 240 is incorporated in the current sensing circuit 300, and the floating ground terminal COM_F and the floating power supply terminal Vdd_F are connected to each of a first differential amplifier 412 of a first shunt resistor sensing circuit 410 (for a first current range) and a second differential amplifier 444 of a second shunt resistor sensing circuit 442 (for a second current range), which respectively amplify a voltage between the two ends of the shunt resistor 106. The floating power supply 240 is configured to receive as an input the electric potential of a point V, which is equivalent to the point P of FIG. 4 and which generates the electric potential of the floating ground terminal COM_F and the voltage of the floating power supply terminal Vdd_F.

A first differential voltage divider 414 is incorporated between the first shunt resistor sensing circuit 410 and the first LPF 314 to convert the output of the first shunt resistor sensing circuit 410 into a voltage that is referenced to the electric potential of the analog ground terminal COM_A. The result is connected to the first adder 320. A second differential voltage divider 446 is incorporated between the second shunt resistor sensing circuit 442 and the second LPF 344 to convert the output of second shunt resistor sensing circuit 442 into a voltage that is referenced to the electric potential of the analog ground terminal COM_A. The result is connected to the second adder 350.

The first and second CTs 302 and 304, the first and second CT sensing circuits 370 and 380, and the first and second gain adjustment amplifiers 378 and 388 may be substantially the same as those described above with referenced to the third embodiment depicted in FIG. 5. The floating power supply 240 may also be the substantially the same as that described above with reference to the second embodiment depicted in FIG. 4. Operation of the various components of the current sensing circuit 400 are described above according to their respective embodiments.

In the thus configured current sensing circuit 400, an ADC that has only four-digit dynamic range or less may be used for cost advantage. In addition, the current sensing circuit 400 may incorporate the circuit which runs on the potential of COM_F and that of Vdd_F with the input end having a high impedance. This enables handling of a high electric potential that is input to a shunt resistor sensing circuit (e.g., the shunt resistor sensing circuit 200), while accomplishing a wide dynamic range in a manner that is advantageous in terms of cost.

Figure 11A:
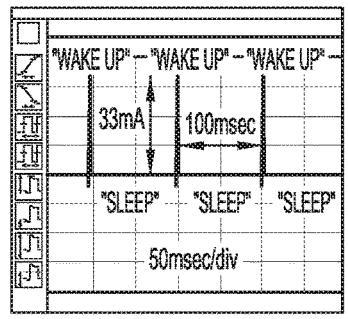
FIG. 11A to FIG. 11C are graphs showing measurement results of the current sensing circuit of FIG. 6.
Figure 11B:
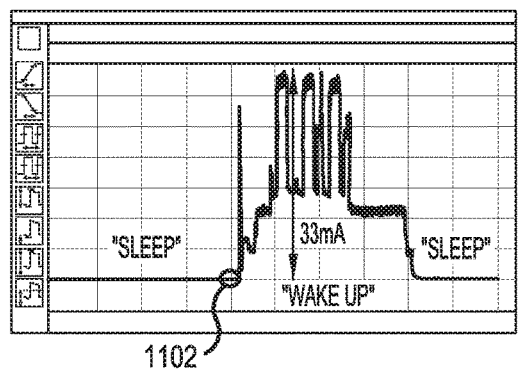
Figure 11C:
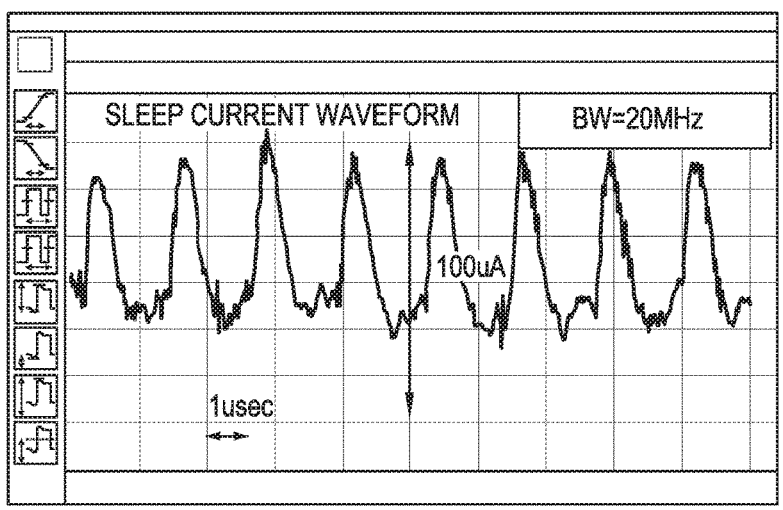
Figure 12A:
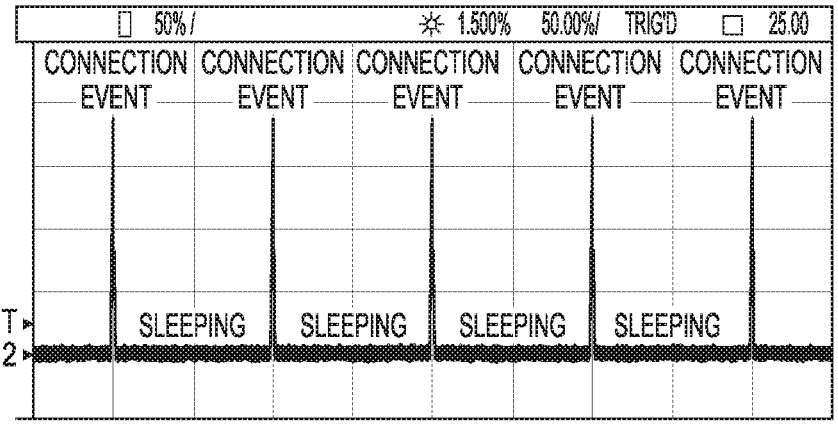
FIG. 12A and FIG. 12B are graphs showing measurement results a conventional sensing circuit.
Figure 12B:
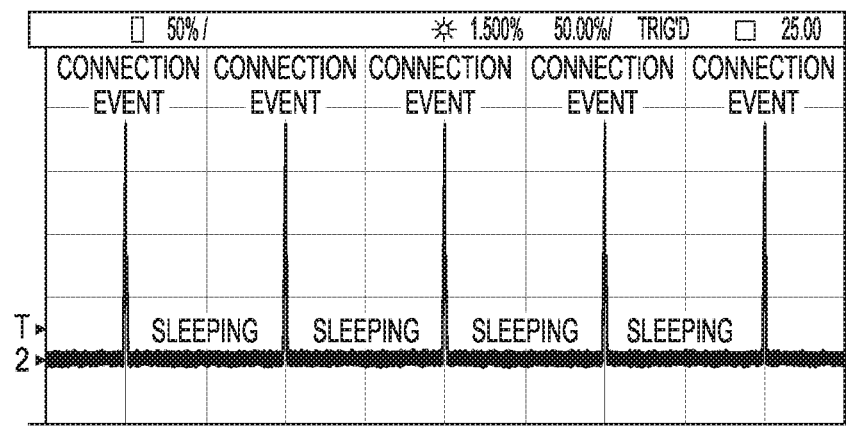

FIG. 11A to FIG. 11C are graphs showing results of measuring a DUT compatible with BLE standards using the current sensing circuit 400, e.g., when the first current range is a 200 mA range, the second current range is a 2 mA range, and the shunt resistance is about 0.25Ω. FIG. 11A is a graph showing a waveform that has sleep states (or sleep periods) and active states (including wake-up periods) in FIG. 12A. An enlarged view of the waveform of a wake-up period in FIG. 11A is shown in FIG. 11B. An enlarged view of a partial waveform of a sleep period in FIG. 11B is shown in FIG. 11C.

The results in FIG. 11B, which are measured at 200 mA full scale range, and the results in FIG. 11C, which are measured at 2 mA full scale range, are obtained simultaneously, but are shown separately for convenience of description. The section shown in FIG. 11C is a sleep period, in which the power consumption of an IC needs to be on an ignorable level but, in actuality, some of functional blocks in the IC are in operation. It may be seen in FIG. 11C that the current sensing circuit 400 has succeeded in capturing even the slight fluctuations in current consumption that are caused by this activity of the blocks, without missing any. Measuring the waveform of a current as small as the one shown in FIG. 11C, while observing the overall profile as the one in FIG. 11B has been difficult with conventional current sensors, in which the current signal is buried in noise.

The effects shown in FIG. 11A to FIG. 11C are obtained in any one of the embodiments described above. According to various embodiments, current signals from around 1 µA to 200 mA may thus be measured accurately, and current shifts including quick ones on the order of 1 µs may be followed.

In the fourth embodiment discussed with reference to FIG. 6, optimum resistances of the input resistor 372 of CT sensing circuit 370 and the input resistor 382 of CT sensing circuit 380 may be obtained by Expression (6), above. The floating power supply 240 of FIG. 6 may alternatively be connected to a point W, which is equivalent to the point Q of FIG. 4. Also, the number of current ranges used is not limited to two, and may be expanded to three or more, without departing from the scope of the present teachings. Examples of alternative modes of implementing the adder and the LPF functions and the extensibility of the current sensing range in the first embodiment may apply to the forth embodiment, as well.

Figure 13:
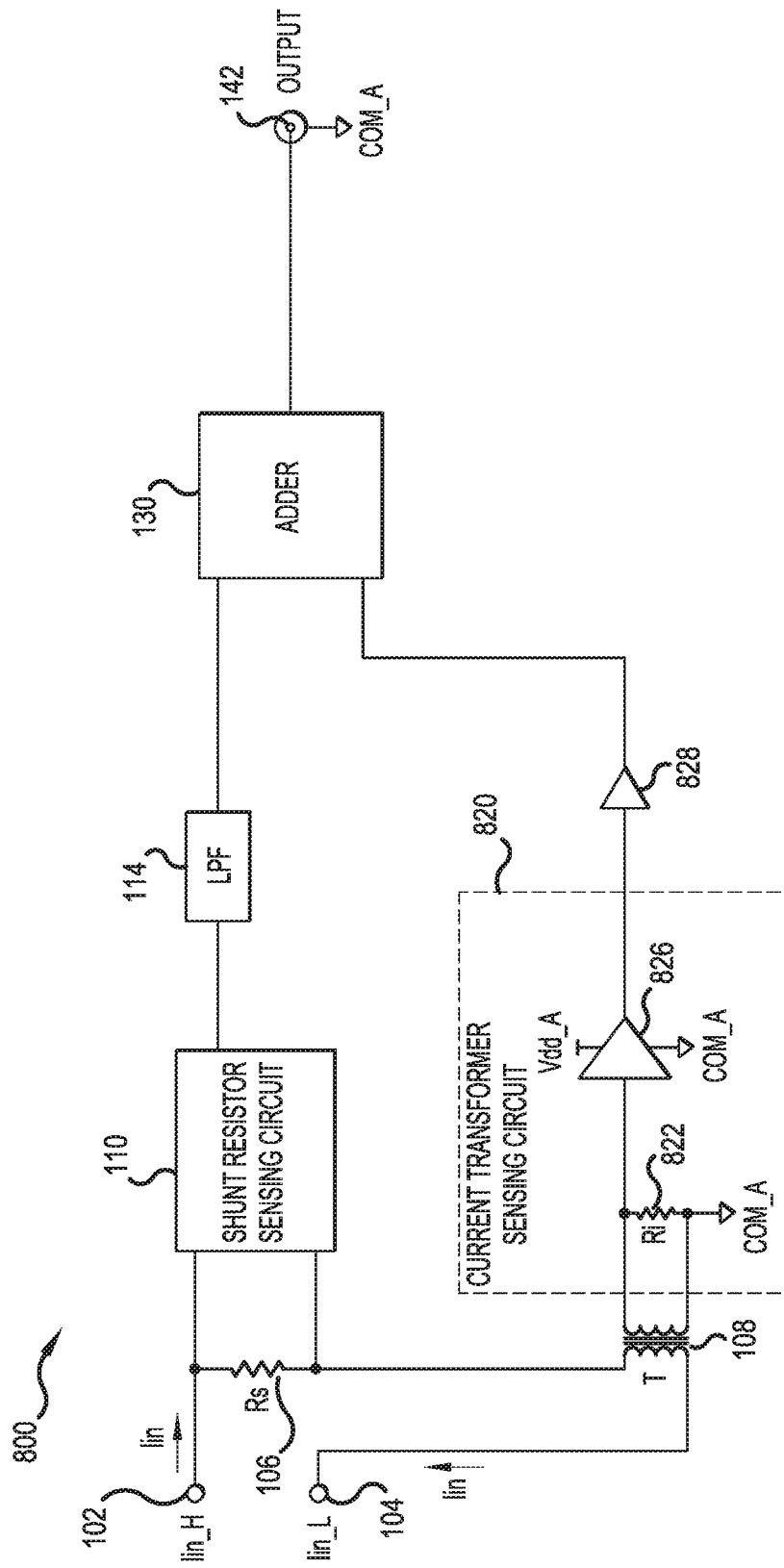
FIG. 13 is a block diagram of a current sensing circuit, according to a representative fifth embodiment.

FIG. 13 is a block diagram of a current sensing circuit, according to a representative fifth embodiment. Referring to FIG. 13, a current sensing circuit 800 includes a CT sensing circuit 820 and a gain adjustment amplifier 828, as well as the shunt resistor 106, the CT 108, the shunt resistor sensing circuit 110, the LPF 114 and the adder 130, discussed above. The CT sensing circuit 820 includes a shunt input resistor 822 and a CT output sensing amplifier 826. The shunt input resistor 822 corresponds to the input resistor 122 connected in series in the first embodiment depicted in FIG. 1, for example, but is arranged on the secondary winding side of the CT 108 to be connected between the two end terminals of the secondary winding of the CT 108. A non-ground-side terminal of the secondary winding of the CT 108 is connected to an input terminal of the CT output sensing amplifier 826. The output of the CT output sensing amplifier 826 is connected to the adder 130 via the gain adjustment amplifier 828. The same power supply voltage and ground potential as those in the first embodiment are supplied to each of the CT output sensing amplifier 826 and the gain adjustment amplifier 828. Components other than the CT sensing circuit 820 and the gain adjustment amplifier 828 are the same as the corresponding components in the first embodiment.

An equivalent circuit of the CT 108 and the CT sensing circuit 820 in the current sensing circuit 800 is the same as the equivalent circuit shown in FIG. 2. The optimum resistance of the shunt input resistor 822 that minimizes noise may be obtained by Expression (6), above.

The fifth embodiment depicted in FIG. 13 employs an alternative method of implementing a CT sensing circuit. Generally, an advantage of using a transimpedance amplifier (e.g., CT output sensing amplifier 126 and feedback resistor 124) in a CT sensing circuit (e.g., CT sensing circuit 120) is that the resistance Ri of the input resistor (e.g., 122) and the resistance Rf of the feedback resistor (e.g., 124) may be selected independently of each other, which means that a large current-to-voltage conversion gain may be set to the CT sensing circuit irrespective of the resistance Ri, and that setting an appropriate S/N ratio is easy. On the other hand, a current on the secondary side of the CT (Iin/N) needs to be supplied from the transimpedance amplifier itself. This means that, in the case when the measurement current range becomes large, the amplifier needs to have a relatively large current output, which imposes a design burden.

In the fifth embodiment depicted in FIG. 13, the resistance Ri of the shunt input resistor 822, at which an output current of the CT 108 is converted into a voltage, is determined by Expression (6), where the noise is minimized, and the current-to-voltage conversion gain of this amplifier alone may therefore not be enough. The fifth embodiment therefore has a disadvantage in that the need to select the CT output sensing amplifier 826 to have a large gain, or the need to add an additional amplifier, increases the burden on design in terms of cost. However, even when the measurement current range is relatively large, it is sufficient when a current of Iin/N may circulate to the CT 108 via the resistor 822, and this margin lightens the burden on design, which is advantageous.

The number of current ranges used in this embodiment is not limited to two, and may be expanded to three or more. Examples of alternative modes of carrying out the adder and the LPF functions and the extensibility of the current sensing range in the first embodiment of FIG. 1 apply to the fifth embodiment of FIG. 13 as well. The fifth embodiment may be combined with the second embodiment to the fourth embodiment.

Figure 14:
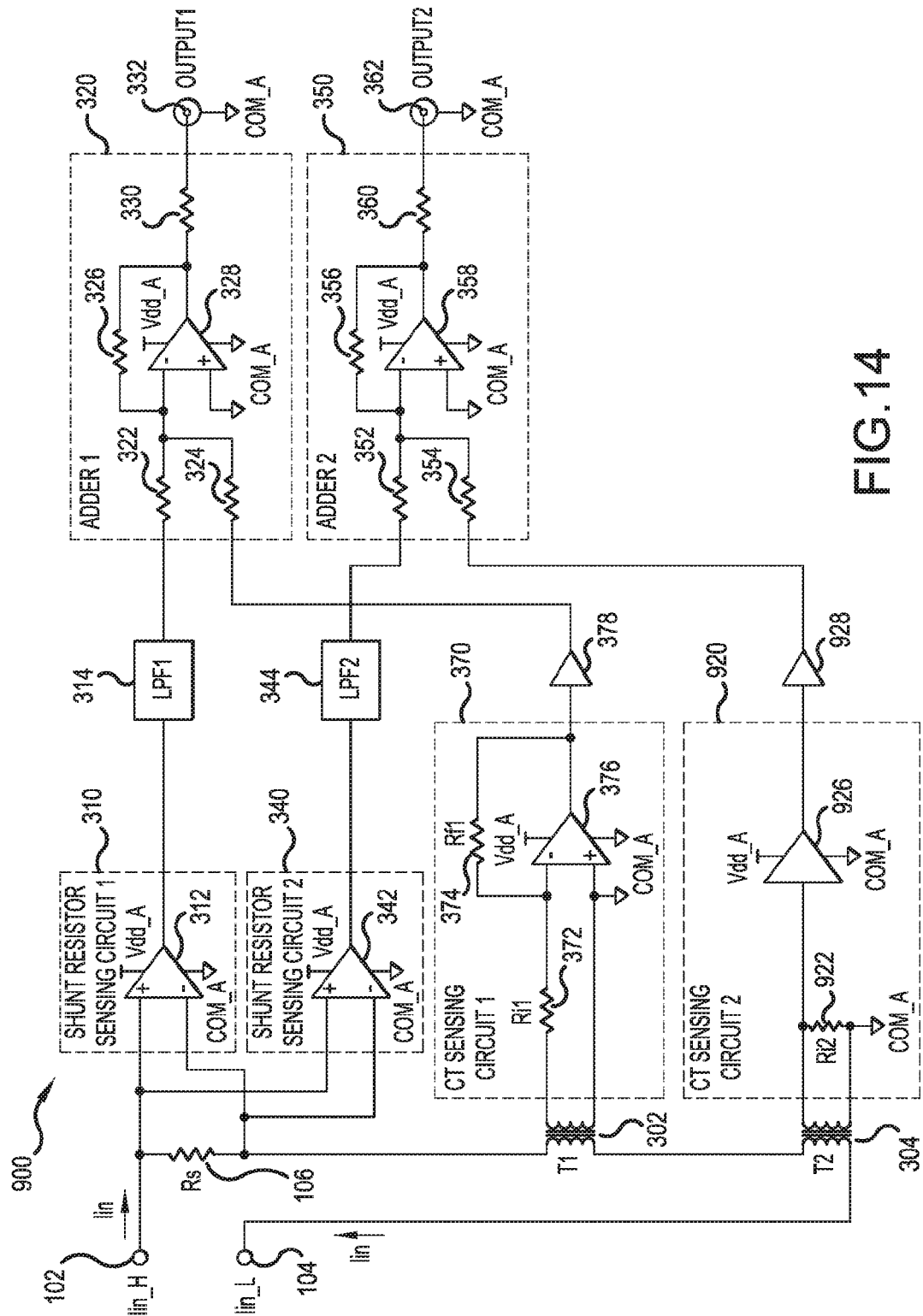
FIG. 14 is a block diagram of a current sensing circuit, according to a representative sixth embodiment.

FIG. 14 is a block diagram of a current sensing circuit, according to a representative sixth embodiment. Referring to FIG. 14, a current sensing circuit 900 is an example of an alternative mode of implementing the current sensing circuit shown in FIG. 5. In FIG. 14, the second CT sensing circuit 380 and the second gain adjustment amplifier 388 of FIG. 5 are replaced by second CT sensing circuit 920 and second gain adjustment amplifier 928, which are higher in current range than the first CT sensing circuit 370 of FIG. 14.

The second CT sensing circuit 920 includes a shunt input resistor 922, which corresponds to the input resistor 382 connected in series with the second CT output sensing amplifier 386 in the third embodiment of FIG. 5. The shunt input resistor 922 is arranged on the secondary winding side of the second CT 304 to be connected between the two end terminals of the secondary winding of the second CT 304. A non-ground-side terminal of the secondary winding of the second CT 304 is connected to an input terminal of the second gain adjustment amplifier 926. The output of the amplifier 926 of the second CT sensing circuit 9210 is connected to the second adder 350 via a gain adjustment amplifier 928. The same power supply voltage and ground potential as the amplifiers 826 and 828 in FIG. 13 are supplied to each of the amplifiers 926 and 928. Components other than the second CT sensing circuit 920 and the gain adjustment amplifier 928 are the same as the corresponding components in the third embodiment described with reference to FIG. 5.

An equivalent circuit of the second CT 304 and second CT sensing circuit 920 in the current sensing circuit 900 is the same as the equivalent circuit in FIG. 2. The optimum resistance Ri2 of the second input resistor 922 that minimizes noise may be obtained by Expression (6) above.

The second CT sensing circuit 920 is desirably installed for measurement in a higher current range than that of first CT sensing circuit 370. The current sensing circuit 900 includes two CT sensing circuits, one of which is a CT sensing circuit of the type that uses a transimpedance amplifier (first CT sensing circuit 370) and the other of which is a CT sensing circuit of the type that uses a shunt resistor (second CT sensing circuit 920). A current in a lower current range is sensed by the first CT sensing circuit 370 that uses a transimpedance amplifier, whereas a current in a higher current range is sensed by the second CT sensing circuit 920 that uses a shunt input resistor 922. The two types of CT sensing circuits are thus used in combination, so that each is allocated to the current range in which that type of CT sensing circuit has an advantage in terms of performance over the other type.

The first CT sensing circuit 370 and the second CT sensing circuit 920 are not necessarily limited to the order of the first and second CTs 302 and 304 in FIG. 14. The number of current ranges used in this embodiment is not limited to two, and may be expanded to three or more, without departing from the scope of the present teachings. Examples of alternative modes of carrying out the functions of the adder(s), and the functions of the LPF(s), and the extensibility of the current sensing range in the first embodiment of FIG. 1 apply to the sixth embodiment of FIG. 14 as well. The sixth embodiment shown in FIG. 14 may be combined with the second embodiment shown in FIG. 4 for expansion as in the fourth embodiment shown in FIG. 6.

Generally, according to the various embodiments, a current sensing circuit is provided that has low current noise performance that allows for current measurement from 1 µA to 200 mA and an observation on the order of 1 µA; a dynamic range that allows for the measurement of a change by five digits or more from 1 µA; broad frequency characteristics that are flat over a range of from the DC to 100 MHz or more; and fast response properties capable of tracking a change that occurs in 1 µs or less when the capacitance of a measurement circuit of a DUT compatible with BLE is taken into account.

In the second embodiment and the fourth embodiment, the shunt resistor sensing circuit may be given a high impedance of 100 MΩ or higher at the input end, and may also deal with a high electric potential that is input to the shunt resistor sensing circuit. In the third embodiment and the fourth embodiment, a current sensing circuit may be formed with the use of an ADC having a dynamic range of four digits or less.

In addition, there are a number of derivative advantages. For example, the third embodiment and the fourth embodiment solve a problem in that a current change on the order of 1 μs may not be captured, which arises when the measurement range is switched from one of multiple measurement ranges to another to suit the measurement signal, because the response time for the waveform tracking is impacted by the length of the range switching time. Also, in the sixth embodiment, two CT sensing circuits having current ranges different from each other are used. One type of CT sensing circuit uses a transimpedance amplifier and may be high in amplification level set thereto and has high S/N performance, and the other type of CT sensing circuit uses a shunt resistor and is suitable for an area relatively large in current. These two types of CT sensing circuits are thus used in combination, so that the one of the two types having an advantage in terms of performance over the other type in a particular situation is selected.

While the disclosure references exemplary embodiments, it will be apparent to those skilled in the art that various changes and modifications may be made without departing from the spirit and scope of the present teachings. Therefore, it should be understood that the above embodiments are not limiting, but illustrative.

The invention claimed is:

1. A current sensing circuit for sensing current in a device under test (DUT), the current sensing circuit comprising:
   a first input terminal;
   a second input terminal;
   a first output terminal;
   a shunt resistor having one terminal connected to the first input terminal;
   a first shunt resistor sensing circuit configured to amplify a voltage between the one terminal of the shunt resistor and another terminal of the shunt resistor;
   a first low pass filter coupled to an output of the first shunt resistor sensing circuit, the first low pass filter having a first cutoff frequency;
   a first current transformer comprising a primary winding and a secondary winding, the primary winding being connected between the another terminal of the shunt resistor and the second input terminal, wherein the current transformer has a low frequency-side cutoff frequency that is equal to the cutoff frequency of the low pass filter;
   a current transformer sensing circuit connected to the secondary winding of the first current transformer and configured to amplify a current output from the secondary winding, the first current transformer sensing circuit comprising:
      a first transimpedance amplifier; and
      a first input resistor connected between one terminal of the secondary winding and an input of the first transimpedance amplifier, another terminal of the secondary winding being grounded; and
   a first adder configured to add an output of the first low pass filter and an output of the first current transformer sensing circuit, and to provide the resulting sum as a first output voltage from the first output terminal of the current sensing circuit.

2. The current sensing circuit according to claim 1, further comprising:
   a first gain adjustment amplifier connected to an output terminal of the first transimpedance amplifier and configured to adjust gain of the output of the first transimpedance amplifier, wherein the first adder adds the output of the first low pass filter and the gain adjusted output of the first current transformer sensing circuit at an output terminal of the first gain adjustment amplifier.

3. The current sensing circuit according to claim 1, wherein the shunt resistor has a resistance equal to or greater than about 0.03Ω and equal to or less than about $\tau_{BLE}/C_{byp}\Omega$, wherein $C_{byp}$ represents a total capacitance of a measurement circuit of the DUT, and $\tau_{BLE}$ represents a time constant of the measurement circuit of the DUT that is necessary to obtain an observation waveform.

4. The current sensing circuit according to claim 1,
   wherein a ground terminal of a first differential amplifier in the first shunt resistor sensing circuit, a ground terminal of the first low pass filter, the another terminal of the secondary winding of the first current transformer, a ground terminal of the first transimpedance amplifier of the first current transformer sensing circuit, and a ground terminal of a first summing amplifier in the first adder are connected to an analog ground terminal supplied with an analog ground voltage, and
   wherein a power supply terminal of the first differential amplifier in the first shunt resistor sensing circuit, a power supply terminal of the first transimpedance amplifier of the first current transformer sensing circuit, and a power supply terminal of the first summing amplifier in the first adder are connected to a power supply terminal supplied with a power supply voltage.

5. The current sensing circuit according to claim 1, further comprising:
   an analog ground terminal supplied with an analog ground voltage;
   a first power supply terminal supplied with a first power supply voltage;
   a floating power supply connected to the one terminal of the shunt resistor connected to the first input terminal; and
   a first differential voltage divider arranged between the first shunt resistor sensing circuit and the first low pass filter,
   wherein the floating power supply comprises a floating ground terminal and a floating power supply voltage terminal, the floating ground terminal and the floating power supply voltage terminal being configured to generate a floating ground voltage and a floating power supply voltage, respectively, using a high power supply voltage terminal supplied with a high power supply voltage and the analog ground terminal supplied with the analog ground voltage,
   wherein the first shunt resistor sensing circuit is connected to the floating ground terminal and the floating power supply voltage terminal,
   wherein the voltage divider is configured to use an output of the first shunt resistor sensing circuit and the floating ground voltage to output a divided voltage that is based on the analog ground voltage, and
   wherein the first current transformer sensing circuit and the first adder are connected to the analog ground terminal and the first power supply voltage terminal.

6. The current sensing circuit according to claim 5, wherein the floating power supply further comprises:
   a first buffer configured to buffer and output a voltage of the one terminal of the shunt resistor connected to the first input terminal;
   a first voltage source connected to the high power supply voltage terminal and to the analog ground terminal; and
   a second voltage source, which connects an output of the first buffer to the floating ground terminal, and which is connected to the high power supply voltage terminal and the floating ground terminal to output the floating power supply voltage to the floating power supply voltage terminal.

7. The current sensing circuit according to claim 6, wherein the first buffer comprises a high-input impedance buffer.

8. The current sensing circuit according to claim 5, wherein the first voltage divider is configured to:
divide a voltage output from the first shunt resistor sensing circuit, at a given voltage division ratio to the analog ground voltage, and use the divided voltage as a first input of a first differential amplifier; and
divide the floating ground voltage of the first shunt resistor sensing circuit at the given voltage division ratio to the analog ground voltage, and use the divided voltage as a second input of the first differential amplifier, and
wherein the differential amplifier is connected to the analog ground terminal and the power supply voltage terminal, and is configured to generate the divided voltage, which is output to the first low pass filter.

9. The current sensing circuit according to claim 1, further comprising:
a second output terminal;
a second shunt resistor sensing circuit configured to amplify the voltage between the one terminal of the shunt resistor and the another terminal of the shunt resistor;
a second low pass filter coupled to an output of the second shunt resistor sensing circuit, the second low pass filter having a second cutoff frequency;
a second current transformer comprising a primary winding and a secondary winding, the primary winding being connected between a terminal of the primary winding of the first current transformer and to the second input terminal, wherein the second current transformer has a low frequency-side cutoff frequency that is equal to the second cutoff frequency of the second low pass filter;
a second current transformer sensing circuit connected to the secondary winding of the second current transformer and configured to amplify a current output from the secondary winding, the second current transformer sensing circuit comprising:
a second transimpedance amplifier; and
a second input resistor connected between one terminal of the secondary winding of the second current transformer and an input of the second transimpedance amplifier, another terminal of the secondary winding being grounded; and
a second adder configured to add an output of the second low pass filter and an output of the second current transformer sensing circuit, and to provide the resulting sum as a second output voltage from the second output terminal of the current sensing circuit.

10. The current sensing circuit according to claim 9, wherein the first shunt resistor sensing circuit has a current-to-voltage conversion gain different from a current-to-voltage conversion gain of the second shunt resistor sensing circuit, and the first current transformer sensing circuit has a current-to-voltage conversion gain different from a current-to-voltage conversion gain of the second current transformer sensing circuit.

11. The current sensing circuit according to claim 9, further comprising:
a second gain adjustment amplifier connected to an output terminal of the second transimpedance amplifier and configured to adjust gain of the output of the second transimpedance amplifier, wherein the second adder adds the output of the second low pass filter and the gain adjusted output of the second current transformer sensing circuit at an output terminal of the second gain adjustment amplifier.

12. The current sensing circuit according to claim 9, wherein the shunt resistor has a resistance equal to or greater than $0.03\Omega$ and equal to or less than $\tau_{BLE}/C_{byp}\Omega$, where $C_{byp}$ represents a total capacitance of a measurement circuit of the DUT and $\tau_{BLE}$ represents a time constant of the measurement circuit of the DUT that is necessary to obtain an observation waveform.

13. The current sensing circuit according to claim 9, further comprising:
an analog ground terminal supplied with an analog ground voltage;
a first power supply terminal supplied with a first power supply voltage;
a floating power supply connected to the one terminal of the shunt resistor;
a first voltage divider between the first shunt resistor sensing circuit and the first low pass filter; and
a second voltage divider between the second shunt resistor sensing circuit and the second low pass filter,
wherein the floating power supply comprises a floating ground terminal and a floating power supply voltage terminal, the floating ground terminal and the floating power supply voltage terminal being configured to generate a floating ground voltage and a floating power supply voltage, respectively, using a high power supply voltage terminal supplied with a high power supply voltage and the analog ground terminal supplied with the analog ground voltage,
wherein the first shunt resistor sensing circuit and the second shunt resistor sensing circuit are connected to the floating ground terminal and the floating power supply voltage terminal to operate,
wherein the first voltage divider is configured to use an output of the first shunt resistor sensing circuit and the floating ground voltage to output an output voltage that is based on the analog ground voltage,
wherein the second voltage divider is configured to use an output of the second shunt resistor sensing circuit and the floating ground voltage to output an output voltage that is based on the analog ground voltage, and
wherein the first current transformer sensing circuit, the first adder, the second current transformer sensing circuit, and the second adder are connected to the analog ground terminal and the first power supply voltage terminal to operate.

14. The current sensing circuit according to claim 13, wherein the floating power supply further comprises:
a first buffer configured to buffer and output a voltage of the one terminal of the shunt resistor;
a first voltage source connected to the high power supply voltage terminal and to the analog ground terminal; and
a second voltage source, which connects an output of the first buffer to the floating ground terminal, and which is connected to the high power supply voltage terminal and the floating ground terminal to output the floating power supply voltage to the floating power supply voltage terminal.

15. The current sensing circuit according to claim 13, wherein the first voltage divider is configured to:
divide a voltage output from the first shunt resistor sensing circuit, at a given voltage division ratio to the analog ground voltage, and use the divided voltage as a first input of a first differential amplifier; and divide the floating ground voltage of the first shunt resistor sensing circuit at the given voltage division ratio to the analog ground voltage, and use the divided voltage as a second input of the first differential amplifier, wherein the first differential amplifier is connected to the first input, the second input, the analog ground terminal, and the first power supply voltage terminal, and is configured to generate an output voltage of the first differential amplifier, wherein the second voltage divider is configured to:

divide a voltage output from the second shunt resistor sensing circuit, at a given voltage division ratio to the analog ground voltage, and use the divided voltage as a first input of a second differential amplifier; and divide the floating ground voltage of the second shunt resistor sensing circuit at the given voltage division ratio to the analog ground voltage, and use the divided voltage as a second input of the second differential amplifier, and wherein the second differential amplifier is connected to the first input, the second input, the analog ground terminal, and the first power supply voltage terminal to operate, and is configured to generate an output voltage of the second differential amplifier.

16. A current sensing circuit for sensing current in a device under test (DUT), the current sensing circuit comprising:
 a first input terminal,
 a second input terminal,
 a shunt resistor having one terminal connected to the first input terminal;
 a current transformer comprising a primary winding having one terminal connected to another terminal of the shunt resistor, and another terminal connected to the second input terminal;
 a shunt resistor sensing circuit configured to amplify a voltage between the one terminal of the shunt resistor and the another terminal of the shunt resistor;
 a low pass filter connected to an output of the shunt resistor sensing circuit and having a cutoff frequency;
 a current transformer sensing circuit coupled to a secondary winding of the current transformer and configured to amplify a current that is output from the secondary winding; and
 an adder coupled to an output of the low pass filter and an output of the CT output sensing amplifier, the adder being configured to add the outputs of the low pass filter and the CT output sensing amplifier and to output the sum to an output terminal of the current sensing circuit,
 wherein the current transformer has a low frequency-side cutoff frequency that is equal to the cutoff frequency of the low pass filter.

17. The current sensing circuit according to claim 16, wherein the current transformer sensing circuit comprises:
 a CT output sensing amplifier; and
 an input resistor connected between a pair of terminals of the secondary winding, one of the pair of terminals of the secondary winding being grounded and another one of the pair of terminals of the secondary winding being coupled to an input of the CT output sensing amplifier.

18. A current sensing circuit for sensing current in a device under test (DUT), the current sensing circuit comprising:
 a first input terminal,
 a second input terminal,
 a first output terminal,
 a second output terminal;
 a shunt resistor having two terminals, one terminal being connected to the first input terminal;
 a first current transformer comprising a primary winding and a second current transformer comprising a primary winding, the primary windings being connected in series between another terminal of the shunt resistor and the second input terminal;
 a first shunt resistor sensing circuit and a second shunt resistor sensing circuit, which are connected in parallel between the one terminal of the shunt resistor and the another terminal of the shunt resistor, and each of the first and second shunt resistor sensing circuits is configured to amplify a voltage between the two terminals of the shunt resistor;
 a first low pass filter connected to an output of the first shunt resistor sensing circuit and having a first cutoff frequency;
 a second low pass filter connected to an output of the second shunt resistor sensing circuit and having a second cutoff frequency;
 a first current transformer sensing circuit connected between a pair of terminals of a secondary winding of the first current transformer, and configured to amplify a current that is output from the pair of terminals;
 a second current transformer sensing circuit connected between a pair of terminals of a secondary winding of one of the second current transformer, and configured to amplify a current that is output from the pair of terminals;
 a first adder configured to add an output of the first low pass filter and an output of the first current transformer sensing circuit, and to output the sum to the first output terminal;
 a second adder configured to add an output of the second low pass filter and an output of the second current transformer sensing circuit, and to output the sum to the second output terminal,
 wherein the first current transformer sensing circuit comprises:
  a first transimpedance amplifier; and
  a first input resistor arranged between the first current transformer and the first transimpedance amplifier,
  wherein one of the pair of terminals of the secondary winding of the first current transformer that is connected to the first current transformer sensing circuit is grounded, and another of the pair of terminals of the secondary winding of the first current transformer that is connected to the first current transformer sensing circuit is connected to one terminal of the first input resistor, and
  wherein the pair of terminals of the secondary winding of the current transformer, which is connected to the first current transformer sensing circuit, are connected to an input of the first transimpedance amplifier; and
 wherein the second current transformer sensing circuit comprises:
  a second transimpedance amplifier; and
  a second input resistor arranged between the second current transformer and the second transimpedance amplifier,
  wherein one of the pair of terminals of the secondary winding of the second current transformer that is connected to the second current transformer sensing circuit is grounded, and another of the pair of terminals of the secondary winding of the second transformer that is connected to the second current transformer sensing circuit is connected to an input of the second amplifier, and wherein the first current transformer has a low frequency-side cutoff frequency that is equal to the first cutoff frequency, and the second current transformer has a low frequency-side cutoff frequency that is equal to the second cutoff frequency.

19. The current sensing circuit according to claim 18, wherein the first shunt resistor sensing circuit has a current-to-voltage conversion gain different from a current-to-voltage conversion gain of the second shunt resistor sensing circuit, and the first current transformer sensing circuit has a current-to-voltage conversion gain different from a current-to-voltage conversion gain of the second current transformer sensing circuit.

20. The current sensing circuit according to claim 18, wherein, when a resistance of the shunt resistor is given as Rs, an input referred voltage noise spectral density of the first shunt resistor sensing circuit is given as en_inst1, an input referred voltage noise spectral density of the first transimpedance amplifier in the first current transformer sensing circuit is given as en_ct1, a turns ratio of the primary winding and the secondary winding of the current transformer that is connected to the first current transformer sensing circuit is given as N1, an input referred voltage noise spectral density of the second shunt resistor sensing circuit is given as en_inst2, an input referred voltage noise spectral density of the first amplifier in the second current transformer sensing circuit is given as en_ct2, and a turns ratio of the primary winding and the secondary winding of the current transformer that is connected to the second current transformer sensing circuit is given as N2, a resistance Ri1 of the first resistor is expressed by Ri1=(en_ct1/en_inst1)*N1*Rs, and a resistance Ri2 of the second resistor is expressed by Ri2=(en_ct2/en_inst2)*N2*Rs, and wherein, when a primary-side magnetizing inductance of the current transformer that is connected to the first current transformer sensing circuit is given as Li1 and a primary-side magnetizing inductance of the current transformer that is connected to the second current transformer sensing circuit is given as Li2, the first cutoff frequency given as fc1 is expressed by fc1=Ri/(2*π*N1$^2$*Li1), and the second cutoff frequency given as fc2 is expressed by fc2=Ri/(2*π*N2$^2$*Li2).

* * * * *